United States Patent [19]
Johnson

[11] Patent Number: 5,414,741
[45] Date of Patent: May 9, 1995

[54] LOW PHASE NOISE OSCILLATOR FREQUENCY CONTROL APPARATUS AND METHOD

[75] Inventor: Kent K. Johnson, South Lake Tahoe, Calif.

[73] Assignee: Litton Systems, Inc., Santa Clara, Calif.

[21] Appl. No.: 137,278

[22] Filed: Oct. 14, 1993

[51] Int. Cl.$^6$ .......................... H03L 7/00; H03D 3/24
[52] U.S. Cl. ........................................ 375/376; 331/18
[58] Field of Search .......................... 331/18; 375/120

[56] References Cited

U.S. PATENT DOCUMENTS

| | | | |
|---|---|---|---|
| 3,740,671 | 6/1973 | Crow et al. | 333/70 |
| 3,740,671 | 6/1973 | Crow | 333/70 |
| 3,878,474 | 4/1975 | Runge | 331/10 |
| 3,878,522 | 4/1975 | Gurak et al. | 343/117 |
| 4,053,834 | 10/1977 | Lerner | 325/46 |
| 4,077,016 | 2/1978 | Sanders et al. | 331/4 |
| 4,279,018 | 7/1981 | Carson | 364/514 |
| 4,410,860 | 10/1983 | Kipp et al. | 331/1 A |
| 4,516,743 | 5/1985 | Sweeny et al. | 244/3 |
| 4,559,505 | 12/1985 | Suarez et al. | 331/1 A |
| 4,614,917 | 9/1986 | Zelitzki et al. | 331/1 A |
| 4,672,632 | 6/1987 | Anderson | 375/57 |
| 4,706,263 | 11/1987 | von der Embse | 375/96 |
| 4,841,544 | 6/1989 | Nuytkens | 375/1 |
| 4,860,321 | 8/1989 | von der Embse | 375/96 |
| 4,937,536 | 6/1990 | Reinhardt et al. | 331/8 |
| 5,034,748 | 6/1991 | Goedeke et al. | 342/99 |
| 5,113,257 | 5/1992 | Heerkens | 358/158 |
| 5,239,271 | 8/1993 | Ben-Efraim | 328/14 |

*Primary Examiner*—Edward Coles, Sr.
*Assistant Examiner*—John Ning
*Attorney, Agent, or Firm*—Ronald Craig Fish; Falk, Vestal & Fish

[57] ABSTRACT

A low phase noise third order phase lock loop which can track and eliminate microphonic disturbances and phase hits. The PLL utilizes a third order loop filter which incorporates two integrators. These two integrators, when coupled with the integration which occurs at the voltage control input of the voltage controlled oscillator within the PLL yield an open loop transfer function with a −18 dB/octave rolloff over a band of frequencies which at least encompasses the spectral content of the microphonic or phase hit phase noise disturbance to be eliminated. The open loop gain of the phase lock loop must be set high enough such that the phase lock loop does not oscillate and such that the loop converges and locks. The integrators are implemented with operational amplifiers with RC feedback networks. The values of the components in the RC feedback networks set the frequencies of two zeroes in the transfer function. The frequencies of these zeroes are set by proper selection of the R and C values to cause a change in slope of the open loop gain frequency response curve at the frequency of the zeroes from the −18 dB/octave rolloff to a −6 dB/octave rolloff at the frequency of the zeroes. This causes the phase angle of the open loop PLL transfer function to be more positive than −180 degrees at the frequency at which the open loop gain magnitude frequency response curve falls to unity gain thereby achieving conditional stability. The open loop gain of the PLL is set such that the −18 dB/octave rolloff of the frequency response does not result in a gain of unity until a frequency is reached which is above the highest expected frequency deviation of the carrier caused by microphonic disturbances or phase hits. In the preferred embodiment, the gain is set high enough that the −18 dB/octave rolloff of the open loop gain frequency response extends over at least two decades and extends up to 10 kHz which encompasses substantially all the spectral content of the microphonic disturbance caused by package resonance which sources the phase noise to be eliminated.

9 Claims, 9 Drawing Sheets

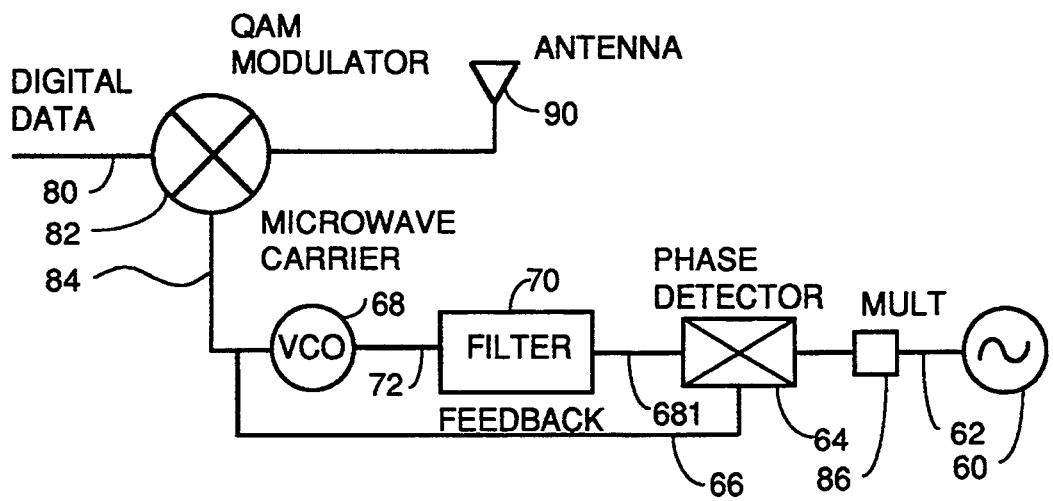
FIG. 6
(PRIOR ART)
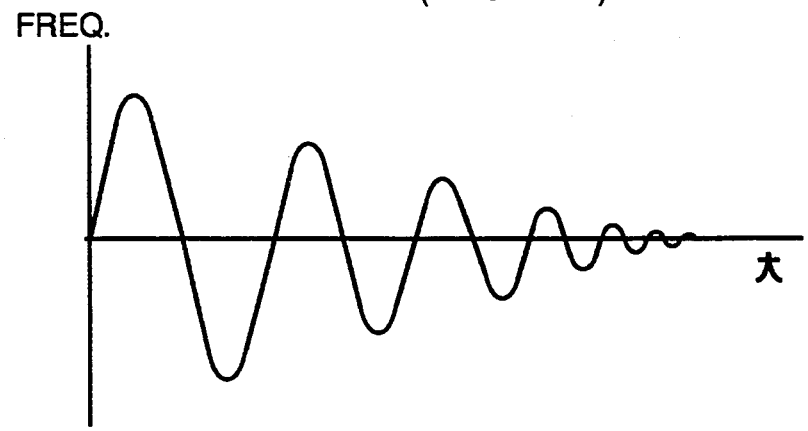
FIG. 7A
$$e^{\alpha t} \sin(\omega_N t + \phi)$$
FIG. 7B
$$\frac{\alpha}{(S+\alpha)^2 + 1}$$
FIG. 8

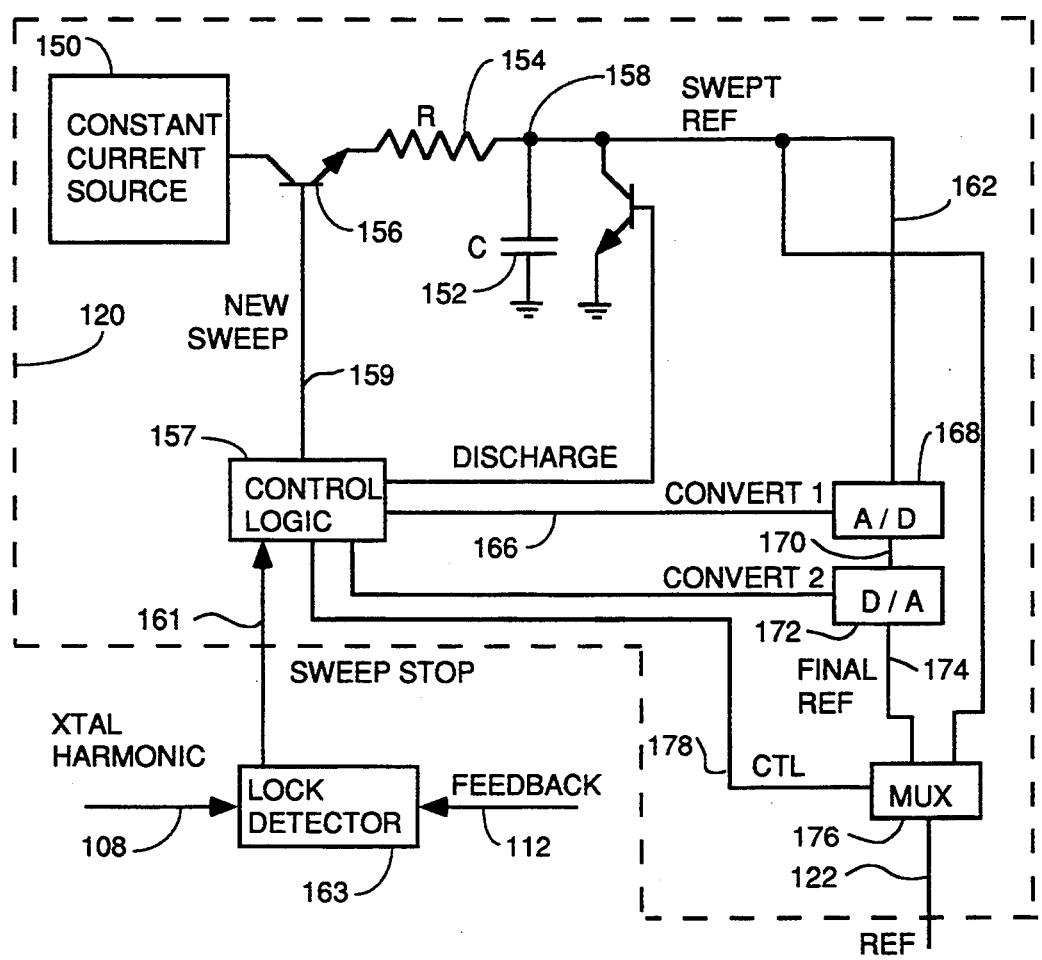
FIG. 11
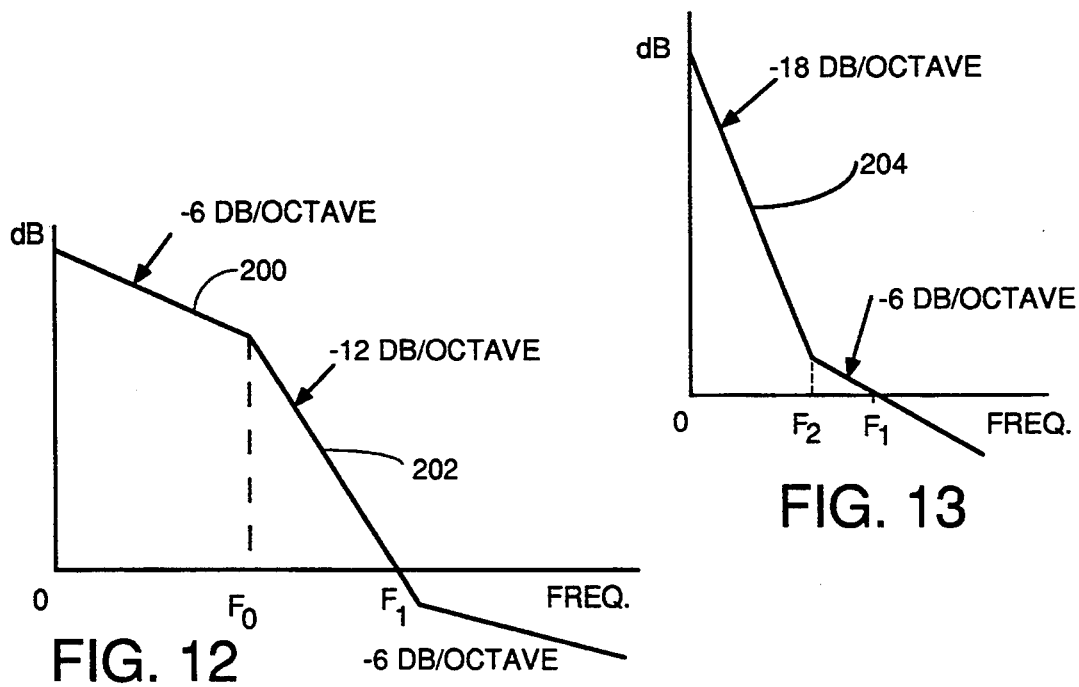
FIG. 12
(PRIOR ART)
FIG. 13

LOW PHASE NOISE OSCILLATOR FREQUENCY CONTROL APPARATUS AND METHOD

BACKGROUND OF THE INVENTION

1. Field of the Invention

The present invention relates to the field of oscillators and modulation schemes therefor. More particularly, the present invention relates to the field of improved frequency control systems for oscillators with low phase noise.

2. Background and the Prior Art

Designers of digital radio frequency telecommunications systems such as the cellular data transmission networks now being contemplated and designed are limited by the Federal Communication Commission in the bandwidth and amplitudes they are allowed to use in various radio frequency bands to communicate data. Designers have an ever present need to transmit as much data as possible within the limitations of the bands given to them by the FCC. As a result, modulation schemes evolved from amplitude modulation where different amplitudes are used to represent information symbols (or digital states), to frequency modulation where different frequencies are used to represent information symbols (or digital states). From there, modulation schemes evolved from phase modulation where a particular phase is used to represent the information to QAM modulation schemes. The QAM modulation scheme uses the phase and amplitude of a carrier frequency relative to a stable frequency, single amplitude reference source to encode digital data. Because regulations imposed by the Federal Communication Commission limit bandwidth and amplitude that may be transmitted, QAM modulation schemes, and many coherent phase shift keying and frequency shift keying modulation schemes arose from the need for more efficient modulation schemes. FIG. 1 shows a symbolic diagram of a QAM modulation scheme.

In FIG. 1, axes 10 and 12 divide space into four quadrants. Spread throughout these four quadrants is a "constellation" of points or symbols, each of which represents a particular member of the encoded information to be transmitted. Each character, such as encoded ASCII A symbol, is encoded into symbol space by setting the phase angle of the carrier relative to the phase angle of the reference at a value equal to the angle between the vector connecting the origin to that point and the axis 10 and by setting the amplitude equal to the amplitude of said vector. Thus, the vector 14 (a phasor vector) may represent an encoded ASCII A symbol while vector 16 represents an encoded ASCII B symbol. An interesting thing about QAM and many other modulation schemes is that the more points that are in the symbol constellation, the easier it is to generate error correction and detection (ECC) bits that detect and correct errors when they occur. Note however, that the greater the number of points in the constellation, the smaller is the angle which exists between adjacent points in the constellation. This is also true for other modulation schemes such as FSK and PSK. This can cause occasional errors in discriminating between different points or information symbols in the constellation if the phase noise of either the transmitter or receiver causes a phase error which is too large. Typical constellations on modern QAM modulation schemes consist of 64 points. Such schemes can only tolerate phase errors of four degrees before data errors occur. There is a trend toward constellations having even more points such as 128 points or as many as 264 points to increase channel efficiency still further. These modulation schemes are demodulated by generation of a coherent carrier in the receiver that is synchronized with the oscillator in the transmitter.

The concept of phase noise is illustrated in FIG. 2. There the statistical distribution of values of amplitude and frequency or instantaneous phase of the carrier frequencies emitted by a local oscillator, which is typically a voltage controlled oscillator, is shown by curve 20. Curve 22 in FIG. 2 represents the statistical distribution of amplitude and frequency or instantaneous phase of the reference frequencies emitted by a crystal controlled reference source. Ideally, both these curves would be a single vertical line at the desired frequency were it not for the existence of phase noise. The vertical amplitude axis is proportional to the probability of carrier energy and the horizontal axis is frequency or instantaneous phase where frequency is simply equal to the rate of change of phase. Phase noise means that the phase of a sinusoidal signal relative to some fixed phase reference represented by line 25 is not fixed and jumps around with some statistical distribution. Line 25 in FIG. 2 represents a pure sinusoidal tone having an amplitude $A_1$ and a fixed phase and frequency $F_{ref}$ to which the local oscillator frequency is to be synchronized coherently in phase. The flat parts of curve 22 represent phase noise which results from the fact that the active devices in a crystal controlled reference oscillator are not perfect and cause some modulation of the pure sinusoid in the form of shifts in the frequency away from the frequency of the pure sinusoidal tone. These shifts occur with the larger shifts occurring with decreasing statistical probability. In other words, at any particular instant in time, the output frequency of the crystal reference source will have the amplitude of the signal represented by line 25 but will have some frequency which is offset from $F_{ref}$ by some delta F with decreasing probability as the shift becomes larger. In other words, point 26 on curve 22 means that the probability or percentage of time that the actual output frequency of the crystal reference source has amplitude $A_1$ and frequency $F_2$ is greater than the probability represented by point 24 that the actual output frequency of the crystal reference source will have amplitude $A_1$ and frequency $F_1$. The Q of the oscillator also is a contributor to phase noise with higher Q oscillators causing narrower phase noise curves about the pure sinusoidal tone represented by line 25.

Curve 20 represents a typical phase noise curve for a microwave oscillator such as a YIG oscillator or a dielectric resonant oscillator. Each species of oscillator has its own peculiar phase noise characteristic. Note that for small frequency delta, the phase noise of the microwave oscillator is higher than that of the multiplied crystal controlled reference source, meaning that the probability of the frequency output by the local oscillator being some frequency different than the frequency $F_{ref}$ decreases with increasing delta F but is greater than the corresponding probability of an output of the same frequency for the crystal reference source. Note that the situation reverses itself at delta $F_2$ or a frequency of $F_1$. The areas under the curves 20 and 22 are the relative or RMS phase noises of the local oscillator and the crystal controlled reference sources, respectively.

Typically, local oscillators in the prior art have their output frequencies and phase locked to the frequency and phase of a reference source by a phase locked loop. The bandwidth or frequency gap between frequencies $F_1$ and $F_3$ in FIG. 2 is significant. This is because the band of frequencies between $F_1$ and $F_3$ in FIG. 2 represents the band wherein it is desirable to lock the frequency and phase of the local oscillator output signal to the frequency and phase of the crystal controlled reference signal for minimum phase noise. Outside the band of frequencies between $F_1$ and $F_3$, the phase noise of the microwave oscillator is better than the phase noise of the crystal controlled reference signal, and it is not desirable to lock the frequency and phase of the local oscillator output signal to the frequency and phase of the crystal controlled reference source.

Because the phase of the encoded symbol relative to the phase of the reference source (carrier or local oscillator) contains the information being sent, phase noise is a large problem because phase noise represents a source of errors. For example, in a QAM modulation scheme with a 64 point constellation, a phase error of four degrees or greater can lead to an incorrect symbol decision or bit error. If the error burst exceeds the range of receiver correction ability, then the frame of data containing the error or error burst will have to be retransmitted resulting in waste of valuable resources. Therefore it is extremely important in radio frequency digital data transmission to control the frequency and phase of the local oscillator so as to minimize the area under the composite phase noise curve of the local oscillator. A composite phase noise curve is a curve like the solid line curve shown at 30 in FIG. 3A. This composite phase noise curve 30 results from the effect of a phase locked loop controlling the frequency and phase of the local oscillator to the phase noise curve of the crystal controlled reference. The normal phase noise curve of the local oscillator is shown as dashed line curve at 34, and the phase noise curve of the crystal controlled reference source is shown as a dotted line curve at 32. Note how the composite phase noise curve conforms to the phase noise curve of the crystal controlled reference source within the frequency band between frequencies $F_1$ and $F_3$, but is allowed to generally assume its own phase noise characteristic outside the frequency band between frequencies $F_1$ and $F_3$.

Several phenomenon which cause phase noise related errors have been noticed in the prior art. One problem is perturbuations in the phase noise curves at specific frequencies which are thought to result from mechanical resonance frequencies in the packaging of the local oscillator or the cavities containing the YIG or dielectric material. FIG. 4 represents a phase noise curve for a local oscillator which has been phase locked to a crystal controlled reference source but which has mechanical package resonance phase noise disturbances. The peaks in phase noise at 50 and 52 are thought to represent the results of excitation of package mechanical resonance frequencies. These peaks will be hereafter referred to as package peaks, and have been found experimentally to occur at a mechanical resonance frequency of approximately 7 Kilo Hertz which causes deviations of the output frequency of the VCO away from the desired reference frequency by up to 7 kHz. These types of phase noise disturbances are also sometimes referred to as microphonics although microphonics is a broad term and also refers to any change or modulation in frequency caused by vibration. Microphonics cause the phase noise curve of an oscillator such as the phase noise curve 20 in FIG. 2 to broaden out and are a source of error of great concern in high efficiency modulation schemes. Much of the work in the prior art in stabilizing DRO and YIG oscillators using phase locked loops centers around the desire to eliminate phase noise caused by microphonics and package peaks.

Another type of phase noise disturbance that occurs are so called phase hits. These are a result of sudden changes in the phase of the local oscillator frequency. The cause of phase hits is sometimes mechanical relief of stress or strain within the package of the oscillator or by sudden unintentional changes in the capacitance of capacitors affecting the frequency of the local oscillator. Phase hits are serious problems because they can cause momentary loss of phase lock altogether which can result in error bursts which exceed the capacity of the ECC bits to detect and correct.

Both of these types of phase noise disturbances must be eliminated in a high quality oscillator sources for digital data transmission by high efficiency radios.

3. The Problem with the Prior Art Approaches

Digital telecommunication systems must have error rates down in the low parts per million range to be considered reliable. The phase noise of an oscillator source is the most important specification for designers of digital telecommunication systems. In the prior art, workers skilled in the art have used second order phase locked loops to attempt to reduce error bursts from package peaks, microphonics and phase hits. The assignee has found that second order PLL's will not adequately compensate for the errors caused by microphonics, phase hits and package peaks even though the manifestations of these phenomena on the phase noise curve is well within the bandwidth of the second order PLL. For example, two package peaks in the phase noise characteristic of a particular phase locked test oscillator were found at 7 kHz resulting from a package resonance excited by tapping on the table on which the oscillator sat. Even though the second order PLL bandwidth was 100 kHz, the package peaks were not eliminated from the phase noise curve. The prior art workers thought that their degraded phase noise characteristics were caused by some phase noise disturbances out very far from the center frequency so they kept increasing their loop bandwidth. However, the real problem was that the type of loop they were building was not adequate to eliminate, i.e., track out, the package peaks or microphonic effects even though the frequencies thereof were well within the bandwidth of the loop. The problem with the prior art second order loops was that they were not able to track and eliminate $\omega/[(s+a)^2+\omega^2]$ terms in the Laplace domain which is what the package resonances and microphonics create. Some workers in the prior art have used third order loops to track and eliminate the effects of doppler shifts in frequency which have $1/s^2$ Laplace domain expressions. However, as will be discussed more fully below, these third order loops are inadequate to eliminate the microphonics problems though they have a third order polynomial denominator in their open loop transfer function they are inappropriate for microphonic disturbances.

A second order loop means that the polynomial representing the overall transfer function of the PLL has no higher term than $s^2$ in denominator of the Laplace transform notation. A typical phase lock loop stabilizing a VCO local oscillator is shown in FIG. 5. A crystal controlled reference 60 generates the low phase noise reference signal on line 62 typically having the phase noise characteristics shown in FIG. 3A at curve 22. A nonlinear phase detector 64 receives the reference signal on line 62 and a feedback signal on line 66 which has the frequency and phase noise characteristics of the VCO local oscillator 68. The VCO typically operates at microwave frequecies such as 6 GHz, while the reference frequency is typically down around 100 Mhz.

The phase detector 64 generates a phase error signal on line 68 which is filtered by a loop filter 70 which typically takes the form of a single integrator such as an operational amplifier having a capacitor in its feedback network so as to integrate the incoming signal. The integrated phase error signal is fed on line 72 into the frequency control input of the VCO 68. Typically a second order loop will have a single integrator as the loop filter 70 which results in a second order transfer function because there is also an inherent integrator in the VCO. It takes at least a second order loop to track and correct for variations in both frequency and phase.

The loop filter 70 has a frequency response curve which in part defines a filter bandwidth. If the open loop gain is established such that the loop has large gain and does not roll off to the unity gain points until the intersection frequencies $F_1$ and $F_3$ are reached, then the closed loop response will track and eliminate any phase or frequency errors within the range of frequencies between $F_1$ and $F_3$, and the composite phase noise curve for the PLL shown in FIG. 5 will have the approximate shape of curve 30 in FIG. 3A. The area of curve 30 between frequencies $F_1$ and $F_5$ and the area between frequencies $F_3$ and $F_4$ represent areas where the loop gain is low. The closed loop transfer function of the PLL of FIG. 5 is essentially 1 when the open loop gain is large so any signal that appears at the output will be locked in frequency and phase to the frequency which appears at the input, i.e., the crystal controlled reference signal. Since the open loop gain is large inside the bandwidth of the loop, the loop will stay locked to the crystal reference frequency and phase inside the loop bandwidth. Outside the loop bandwidth, the open loop gain falls below the unity gain point, and the output signal will have the frequency and phase characteristics of the free running VCO, and that is why curve 30 in FIG. 3A looks like it does. The VCO will run at the crystal controlled reference frequency, but there will be no phase noise reduction outside the loop bandwidth.

Workers in the art have generally tried to use second order loops instead of third order loops to stabilize VCO frequency and phase characteristics because third order loops were thought to be unstable and difficult or impossible to get to converge and lock on the reference phase and frequency. U.S. Pat. No. 3,740,671 to Crow et al. teaches this conventional wisdom at Col. 2, lines 21-23, but teaches use of a third order loop which overcomes these limitations. The teachings of this patent are hereby incorporated by reference. In general, third order loops have been used in the prior art to track carrier signals which were shifting in frequency because of doppler effects. The following U.S. patents teach such applications of third order loops, frequently in the satellite tracking receiver context: 5,034,748; 4,860,321; 4,706,263; 3,878,522; 3,740,671, the teachings of which are hereby incorporated by reference. Third order loops have also appeared in such applications as a spread spectrum communication system (U.S. Pat. No. 4,841,544), a fast settling phase lock loop (U.S. Pat. No. 4,937,536) a beam riding missile guidance system (U.S. Pat. No. 4,516,743) and a narrowband phase modulation system (U.S. Pat. No. 4,053,834). The teachings of all these patents are hereby incorporated by reference.

In a chapter called "Automatic Phase Control" from the book PRINCIPLES OF COHERENT COMMUNICATIONS by Viterbi (McGraw Hill, New York), the author teaches the nonlinear sinusoidal analysis of the phase lock loop acquisition and lock process. Viterbi teaches that PLLs will only lock when a VCO output frquency and phase error result in a point in the phase plane plot of convergence trajectories that lie on a trajectory that are within a PLL "pull-in" range. Viterbi also taught that third order PLLs had rather lackluster performance characteristics under the conditions he taught.

The Crow et al. patent mentioned above incorporates the teachings of a paper published by Tausworthe and Crow of the Jet Propulsion Laboratory in Pasadena, Calif. entitled, "Practical Design of Third-Order Phase-Locked Loops". That paper teaches hybrid PLL's which acquire lock as second-order loops and then convert to third order loop operation by addition of another pole to the loop transfer function to remove loop stress. Tausworthe and Crow taught that Viterbi was wrong in that if the convergence problems of third order loops were separated out and dealt with as a separate problem and the loop transfer function was optimized in a particular manner that third order loops could outperform second order loops. However, Tausworthe and Crow taught that in order to make a third order loop converge, the loop had to be started as a second order loop and then an extra integrator was added to convert the transfer function to third order operations after convergence. Tausworthe and Crow taught a transfer function which had a $-18$ dB/octave frequency response over a small band of frequencies and achieved better results than Viterbi. What they did not realize was what the applicant has discovered, i.e., that they could have achieved far better performance by extending the band of frequencies over which the $-18$ dB/octave frequency response existed.

FIG. 6 shows a typical microwave transmitter using the output of the stabilized and phase locked VCO signal. The encoded digital data to be transmitted enters on line 80 and gets mixed and QAM modulated in modulator 82 with a microwave carrier on line 84 from the output of the local oscillator VCO 68. The components of the PLL are the same as shown in FIG. 5 except that a multiplier 86 is shown to multiply the frequency of the crystal controlled reference 60 up into the microwave frequencies of the desired carrier frequency. Note that the multiplication factor also raises the level of the asymptotic portions 21 and 23 in FIG. 2 of the skirt of the phase noise characteristic of the crystal controlled reference source by an amount proportional to the logarithm of the multiplication factor. The output of the modulator 82 is then applied to a microwave antenna 90. The VCO oscillator can be either a DRO or a YIG based oscillator or some other kind of oscillator.

It is the area underneath the composite phase noise curve which is of greatest significance to radio designers and operators of digital radio transmission systems since the integrating the phase noise curve gives this area in units of degrees of RMS phase noise jitter. Typical QAM modulation schemes modulate data out in the region to the right of frequency $F_4$ in FIG. 3A. Therefore, it is very important to have a very small error under the composite phase noise curve in this region.

The effect of microphonic modulation including package resonance peaks and phase hit modulations are seen in FIG. 3A by inspection of curve 37 shown in dashed lines. These microphonic vibrations and phase hits can substantially broaden the phase noise curve and cause errors or bursts of error which exceed the range of detection and/or correction of the error correction bits.

FIG. 3B illustrates how these errors can occur. Suppose that the phase of the unmodulated carrier is $\phi_{REF}$ and the phase of one encoded symbol in a QAM scheme is $\phi_{REF} + 5°$ while the phase of an adjacent symbol in a QAM scheme is $\phi_{REF} - 5°$. Suppose also that the decoding scheme involves two filters, one for each of these codes. One of these filters monitors for energy in phase window $W_1$, while the other filter monitors for energy in phase window $W_2$. Assume that the information encoded by a segment of carrier modulated in phase window $W_1$ is an ASCII A, while the information encoded by a segment of carrier modulated in phase window $W_2$ is an ASCII B. Now suppose an ASCII A is intended to be transmitted, but because of phase noise, in the particular time window in which the receiver is looking for what was supposed to be an ASCII A, the phase noise causes the carrier to actually have a phase somewhere in the crosshatched region shown at 90. In this example, the filter monitoring phase window $W_2$ will pick up energy while the filter monitoring phase window $W_1$ will not pick up any energy. The result will be an erroneous decoding of an ASCII B when an ASCII A was supposed to have been decoded.

In an attempt to reduce the effects on phase noise of phase hits, package peaks and microphonics, workers in the prior art have generally tried to make a tradeoff by increasing the loop bandwidth of second order PLL's to attempt to control the effects of microphonics at the expense of letting in more phase noise originating with the active devices. The difficulty with this approach is that while it reduces the effect of the microphonics and other sources of phase noise, it makes the overall phase noise worse. Further, it does not eliminate the errors caused by phase hits and microphonics or package peaks totally. The reason overall phase noise is made worse is because when the bandwidth is increased to encompass frequencies outside the range of between $F_1$ and $F_3$, the undesirable phase noise characteristics of the crystal controlled reference source outside $F_1$ and $F_3$ are incorporated into the final composite phase noise curve. If the phase noise could be controlled effectively without increasing the bandwidth of the PLL to include frequencies outside the range of frequencies between $F_1$ and $F_3$, then the more desirable phase noise characteristics of the VCO itself would control the composite phase noise characteristic curve in this range. Such a desired composite phase noise curve is shown at 30 in FIG. 3A.

In today's crowded cities, cellular phone systems are reaching saturation in channel usage in some areas. Because only a limited bandwidth is made available by the FCC for cellular traffic, the signals from cellular devices are split among a finite number of channels. Workers in this art have found that the cellular transmitters on building tops and hilltops need to be spread apart by a certain distance and a particular distance needs to be maintained between transmitters transmitting on the same channel frequency to avoid interference between the transmitters. This limits the number of channels available and limits the number of cellular devices that can be in use in any particular area at any particular time. With the increasing popularity of cellular modems, personal communicators, pagers and other purely digital devices, the limitation on available channel capacity poses a problem for further expansion of the cellular system. Since cellular telephones have proven themselves to be about 12 times more popular than original estimates, a serious shortfall in cellular capacity is beginning to develop.

The invention is applicable to both DRO and YIG oscillators as well as other types of oscillators. The invention also makes possible other new types of modulation schemes such as new types of spread spectrum communications or codivision multiplexing. Such modulation schemes have low probability of interception or detection which is useful in certain applications. The invention makes possible a greater degree of frequency re-use within a band because the frequency of the carrier never has to stop changing when the invention is in use because the third order PLL of the invention can track a carrier frequency which is continuously moving. In prior art spread spectrum communication modulation schemes, the frequency or the phase of the carrier stops changing from time to time such that the modulation scheme involves a series of hops from one frequency or phase to another. Thus, if two transmitters within range of each other both simultaneously hop to the same frequency and dwell there for some short time, there will be an error burst or interference resulting from the signals interferring with each other. With the invention, the frequency or phase dwell time at any particular setting is reduced to zero so the degree of possible interference is reduced to the short time when two transmitters within range of each other sweep past each other in frequency or phase. This allows more signals to be transmitted through a given band of frequencies than was otherwise possible because the transmitters never stop on any particular frequency. This means that the probability is diminished that any two transmitters, which are close enough together physically to interfere, will be transmitting on any particular frequency for a long enough time to cause an error burst which is long enough to be uncorrectable by the ECC bits. The possibility of the availability of these new spread spectrum modulation schemes thus promises to ease the developing shortfall in cellular communication channel capacity. As a fringe benefit, cellular communications will become more secure so interception of private cellular communications will be less likely. This will make cellular communication even more desirable as a mode of communication. These spread spectrum communication schemes with continuously moving carrier frequency require PLL's with great capacity to track and lock onto the phase of a continuously moving reference source.

Accordingly a need has arisen for a PLL design which can track the crystal controlled reference source even in the presence of phase hits, microphonics or package resonances and eliminate these sources of phase noise errors. This will maximize the ability to communicate with the limited frequency resources.

BRIEF DESCRIPTION OF THE INVENTION

According to the teachings of the invention, there is disclosed a low phase noise third order phase lock loop which can track and eliminate microphonic disturbances and phase hits. The PLL utilizes a third order loop filter which incorporates two integrators. These two integrators, when coupled with the integration which occurs at the voltage control input of the voltage controlled oscillator within the PLL yield an open loop transfer function with a −18 dB/octave rolloff over two decades which include the Fourier spectral content of the microphonic disturbance or phase hit to be tracked. In the preferred embodiment, the two decades extend downward from about 10 kHz. The integrators are implemented with operational amplifiers with RC feedback networks. The values of the components in the RC feedback networks set the frequencies of two zeroes in the transfer function. The frequencies of these zeroes are set by proper selection of the R and C values to cause a break back to −6 dB/octave rolloff at the frequency of the zeroes and to cause the phase angle of the open loop PLL transfer function to be more positive than −180 degrees at the frequency at which the open loop gain falls to unity thereby achieving conditional stability. The open loop gain of the PLL is set such that the −18 dB/octave rolloff of the frequency response does not result in a gain of unity until a frequency is reached which is above the highest expected frequency deviation of the carrier caused by microphonic disturbances or phase hits and such that the PLL does not oscillate.

In other words, the applicant has discovered that third order PLL's that outperform second order loops can be built which can be started as third order loops and will automatically converge during a acquisition sweep process. This is done by extending the −18 dB/octave frequency response found in some of the prior art references so as to cover a band of frequencies that is two decades (or at least the bandwidth of the Fourier spectrum of the microphonic disturbance to be tracked) and by giving the PLL adequate open loop gain to insure that the loop does not oscillate and so that only converging trajectories exist in the phase plane (space) plot. If a phase noise disturbance exists which does not have a bandwidth which spans two decades, the −18 dB/octave frequency response characteristic need not necessarily extend over two decades as long as it encompasses the Fourier spectral content of the phase noise disturbance to be eliminated. This −18 dB/octave frequency response slope and the required bandwidth of a minimum of two decades needed to track and eliminate a "ring-down" microphonic disturbance requires for stability purposes that the open loop gain be very high. The gain must be high enough that the open loop gain frequency response curve does not pass through unity gain before the phase angle response curve of the open loop transfer function of the PLL reaches −180 degrees. However, the high gain is needed anyway to insure a bang-bang PLL response characteristic so as to insure that only converging trajectories in the phase plane plot exist.

BRIEF DESCRIPTION OF THE DRAWINGS

FIG. 6 shows a typical direct QAM modulated digital radio system using a PLL to generate the carrier frequency.

FIG. 7A shows a typical microphonic disturbance plotted as the sinusoidal variation in the carrier frequency which exponentially dies out over time.

FIG. 7B shows the time domain expression for the microphonic disturbance shown in FIG. 7A.

FIG. 8 shows the Laplace domain expression for the microphonic disturbance shown in FIG. 7A.

FIG. 11 shows an alternative embodiment for a lock acquisition circuit.

FIG. 12 is a graph of a typical frequency response gain magnitude curve for a typical prior art PLL.

FIG. 13 shows a typical frequency response gain magnitude curve of a PLL according to the teachings of the invention.

DETAILED DESCRIPTION OF A PREFERRED EMBODIMENT

Local oscillators used in a rather sizeable telecommunications market have been mostly of the cavity or DRO type which stands for dielectric resonator oscillator. Cavity and multiplied crystal oscillators are also found frequently in this art. DRO oscillators comprise a dielectric material within a cavity. The advantages of these types of oscillators are that they have a high Q (low phase noise) and are relatively small. These oscillators are generally used in a frequency range from 2 to 18 Ghz, but since they have a small tuning range, multiple oscillators must be used to cover entire communications bands. Typically, these oscillators are tuned mechanically in open loop configurations for low level use. DRO tuning ranges covers only 1–2% of the band, so many oscillators need to be used to cover the various frequency ranges within the 2–18 Ghz band. Also, these types of oscillators are subject to electrical pulling, typically via a varactor, during tuning such that their tuning linearity degrades as does their Q and phase noise. These types of oscillators are also subject to microphonics, i.e., changes in frequency and generations of sidebands caused by vibrations.

Figure 1:
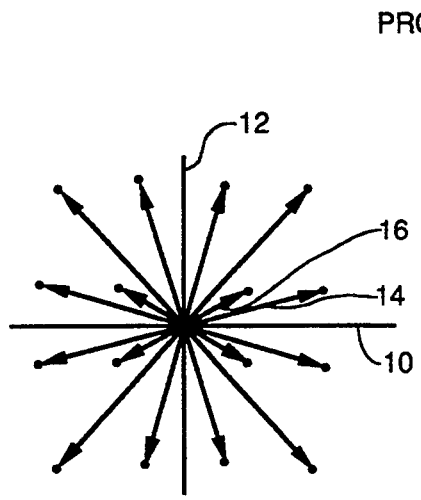
FIG. 1 is a diagram of a 16 symbol QAM modulation scheme.
Figure 2:
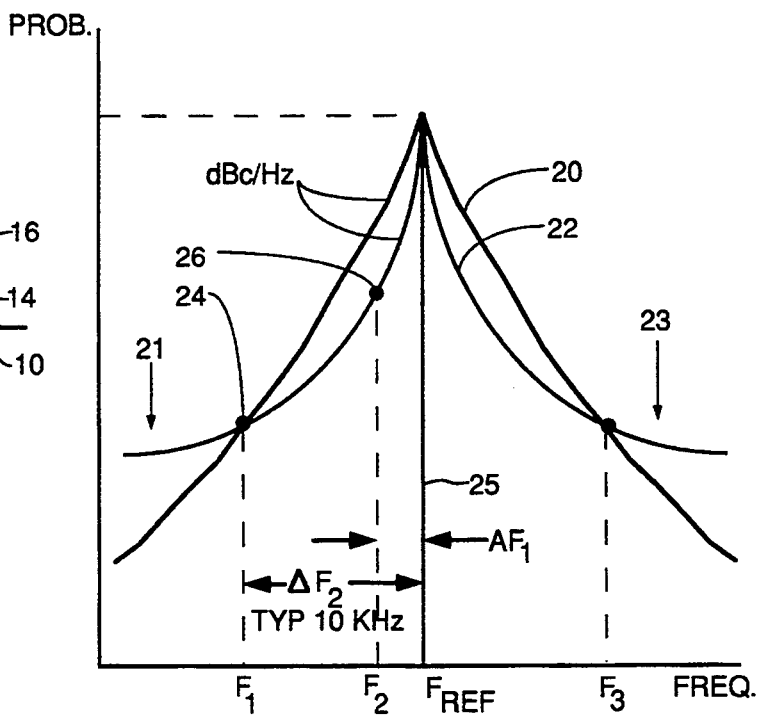
FIG. 2 is a drawing illustrating the differences in phase noise characteristics of a crystal controlled reference signal and a VCO output signal.
Figure 3A:
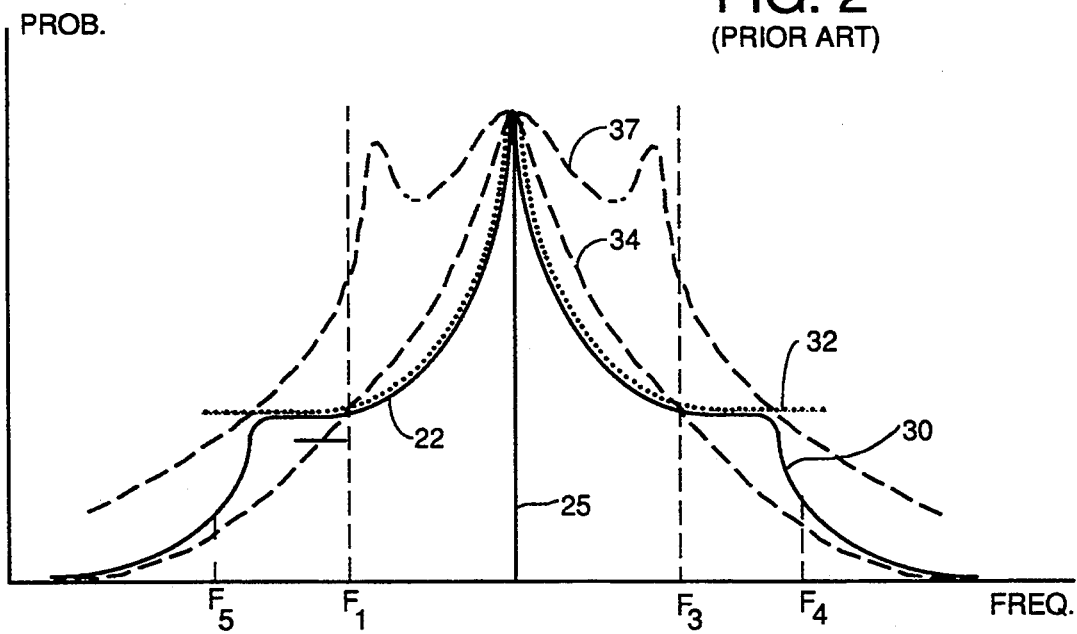
FIG. 3A is an illustration of a desirable composite phase noise characteristic of a PLL which has been phase locked to a crystal controlled reference signal at least out to the crossover point where the phase noise of the VCO becomes better than that of the multiplied crystal controlled reference signal.
Figure 3B:
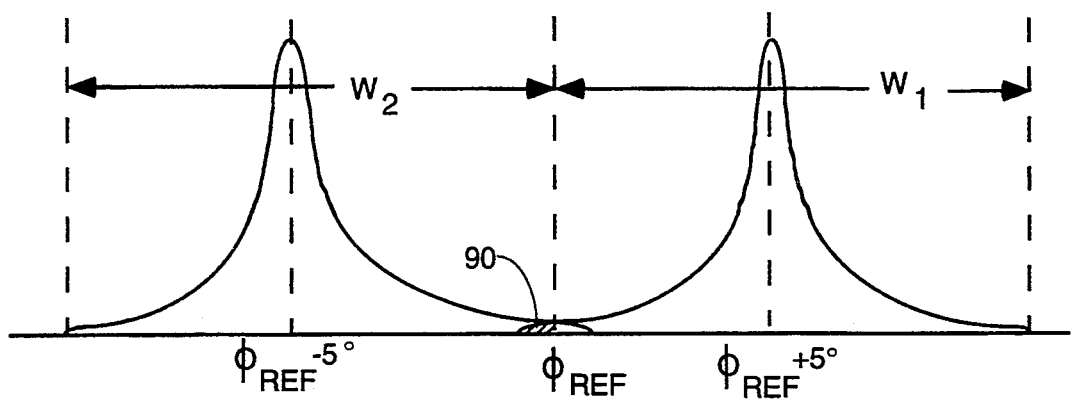
FIG. 3B is an illustration of how high phase noise can cause errors in digital radio QAM modulated systems.
Figure 4:
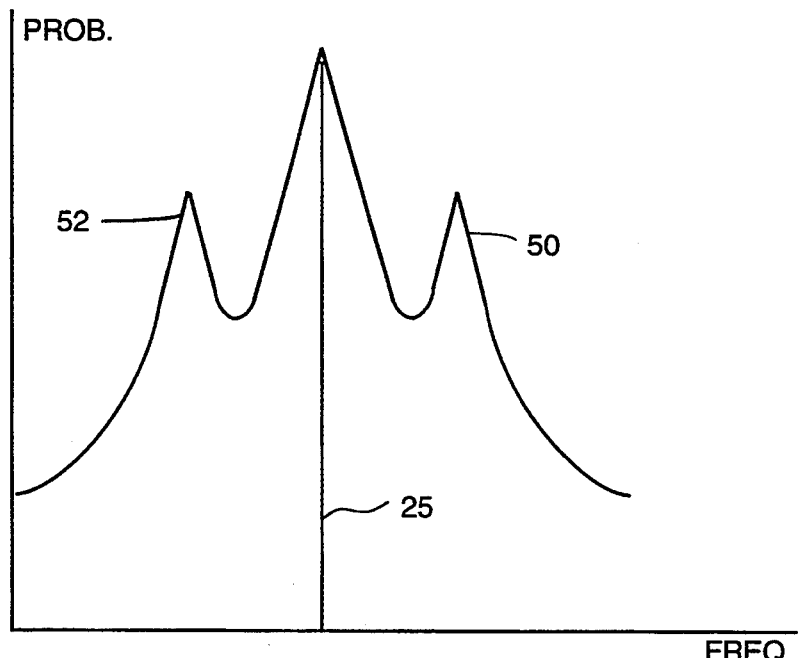
FIG. 4 shows the composite phase noise of a PLL which has been phase locked to a crystal controlled reference signal using a loop filter which is either second order or third order but of inadequate design to track and remove the complex sinusoidal, exponentially decaying nature of microphonic phase noise disturbances.
Figure 5:
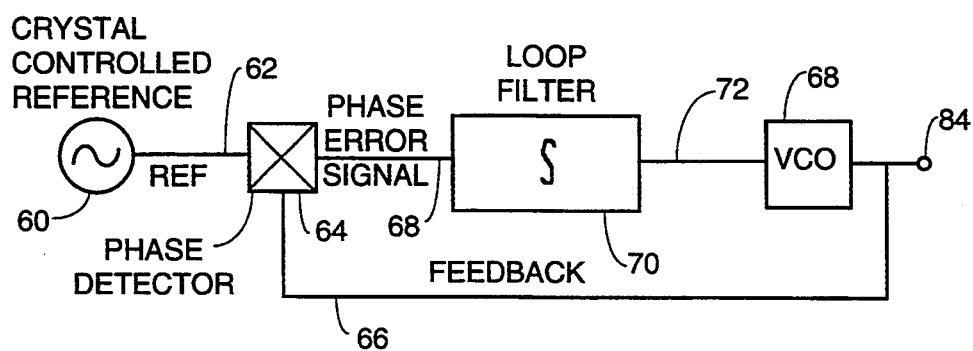
FIG. 5 shows a typical prior art PLL.

To improve the frequency stability performance of DRO oscillators, workers in the art placed these oscillators into phase locked loops (PLL). The purpose of the phase locked loop was to lock the frequency of the DRO to the frequency and phase of a crystal controlled reference. This improved the phase noise characteristics of the DRO to the approximate phase noise of the crystal controlled source at least at frequencies close to the ideal reference frequency and improved the stability of the sources. Phase noise is caused by thermal and by other sources. The result is an improved statistical distribution of phase of the local oscillator signal relative to the phase of the crystal controlled reference source. By using a PLL, the phase noise of the local oscillator could be reduced to that of the crystal controlled reference at "close in" frequencies, i.e., frequencies close to the desired carrier frequency represented by line 25 in FIG. 3A.

To further improve phase noise performance, some designers have turned to YIG oscillators which have higher Q than DRO oscillators. Higher Q allows less phase noise. YIG oscillators are also generally smaller than DRO oscillators, and they have a greater tuning range. Generally, YIG oscillators have tuning ranges near ±10% which means that one YIG oscillator is all that is needed to cover the entire FCC allocated telephony band. YIG oscillators, unlike DRO oscillators are electrically tunable and are linear throughout the tuning range with no Q degradation. Unfortunately, YIG oscillators are typically more susceptible to microphonic disturbances than DRO's and, as a result, designers have tried to minimize the effect of both microphonic disturbances and phase hits by putting YIG oscillators into PLL's to improve the phase noise characteristics.

A Third Order Phase Lock Loop For Oscillator Frequency Control With Low Phase Noise Referring to FIG. 7A, there is shown the frequency disturbance pattern of a typical microphonics episode after some physical disturbance such as a knock on the oscillator or its supporting structure excites a package resonance frequency. The vertical axis in FIG. 7A represents the resulting amount of deviation in oscillator output frequency away from the desired crystal controlled multiplied reference frequency. The horizontal axis represents time. Note the decaying nature of the disturbance. This means that the deviation in frequency of the oscillator output frequency relative to the desired output frequency varies sinusoidally over time and becomes less and less as time goes by, i.e., the frequency deviation decays sinusoidally over time as the vibration of the package at its resonance frequency dies out because of damping of the physical vibration of the package. The time domain expression for this microphonic frequency deviation is shown in FIG. 7B. As seen there, an exponential term decaying with the time constant $\alpha$ is superimposed upon the sinusoidal variation from the reference frequency of the crystal controlled reference oscillator, with the microphonic disturbance sinusoidally varying at the mechanical resonance frequency of the package, $\omega_n$. The phase term $\phi$ is typically zero and simply represents the fact that the mechanical vibration resulting from the microphonic disturbance starts vibrating at zero displacement.

The time domain function of the microphonic disturbance shown in FIG. 7A represents an error term in the output frequency of the oscillator being stabilized which a PLL loop must be able to track and eliminate to eliminate microphonic disturbance error bursts. Since the phase detector is coupled to the output of the oscillator being stabilized, and since frequency is the first derivative of phase, if the time domain function of FIG. 7A is integrated, the phase disturbance resulting from the microphonic disturbance will be obtained. The function of FIG. 7A, when integrated, gives a complicated decaying function in phase which will be compared by the phase detector to the more or less pure sinusoidal phase variation output by the crystal controlled reference oscillator. The phase detector will then compare the two signals and output a complicated, decaying error signal which is integrated by the PLL filter and converted into an error voltage controlling the VCO output frequency. The Laplace transform of the time domain function shown in FIG. 7A is shown in FIG. 8. Note that the presence of the exponentially decaying term in front of the sinusoid term of FIG. 7B causes an $s^2$ term plus some other lower order terms in the denominator of the Laplace expression of FIG. 8. This $s^2$ term will also be present in the error signal generated by the phase detector, so at least a third order PLL or higher will be necessary to dynamically track and remove such a microphonic disturbance. Note, that the optimal filtering techniques (Wiener) would suggest a more complicated loop filter than a double integrator. Unlike Doppler loops, the strong signal level enables the double integrator to function optimally for microphonic disturbance reduction.

Third order loops have been used in the prior art to track and lock onto a signal that was varying linearly in frequency by Doppler shift, but nobody is believed to have realized that third order loops are necessary and sufficient to track and eliminate the sinusoidal or exponentially decaying sinusoid frequency variation resulting from a phase hit or microphonic sinusoidal variation from vibration. Most physical packages have only one major mechanical resonance frequency, so if a third order loop is built which can track and remove the damped microphonic disturbance of FIG. 7A, then substantially all microphonic disturbances will be eliminated from the phase noise characteristic of the PLL. Even if there were two separate microphonic disturbance resonance frequencies within the bandwidth of the loop, as long as they were both of order no higher than $s^2$, i.e., so long as they both are damped in that their amplitude dies out over time, the third order loop according to the teachings of the invention will successfully remove these disturbances from the phase noise characteristic.

Prior art third order loops adapted to track doppler shifts in frequency are not optimized to eliminate microphonic disturbances. The reason is that Doppler shifts lead to a linear frequency change over time and rarely if ever lead to a shift in frequency that approaches the microphonic ringing bandwidth. Further, the microphonic disturbance is damped and "rings down" over time. Therefore, there is much greater spectral content in the microphonic disturbance than in a Doppler shifted signal, and therefore a third order loop adapted to eliminate a Doppler shift does not have an adequate frequency response characteristic of its transfer function to completely eliminate microphonic disturbances.

Prior art workers have attempted to widen second order loop bandwidths and optimize damping coefficients to eliminate microphonic disturbances by improving loop dynamics. Though helpful, it is a sub-optimal approach to improving the dynamic error response of the loop when compared to the teachings of this invention.

Higher order loops (third order loops in particular) for better dynamic tracking of receiver input signals with Doppler shifts are substantially different than the teachings of this invention. First, prior art has been concerned with tracking a constantly increasing Doppler shift where this invention tracks a fixed frequency source and eliminates errors which are generated within the loop components. Second, prior art third order Doppler tracking loops have been optimized to eliminate loop stress caused by Doppler shifts which have narrow Fourier spectrums, whereas the teachings of the invention contemplate tracking of broader, more complex damped sinusoidal mechanically generated response. Third, prior art teaches that imperfect integration is the preferred implementation (see Tausworthe et al. cited above). The teachings of the invention teach that perfect integration (−18 dB/octave) over the frequencies of interest is preferred for both the elimination of microphonics and predictable acquisition properties. Over the microphonic frequencies of interest, this invention teaches that a loop transfer function of:

$$F(s) = [(1+\tau_1 s)(1+\tau_2 s)]/s^3 \quad (1)$$

or higher order is both necessary and sufficient to eliminate the complex damped sinusoidal error characteristics caused by microphonic disturbances filtered through the natural mechanical package responses.

For these reasons, prior art third order Doppler tracking loops, primarily designed for receivers, are inappropriate for stable high purity microwave source generation and are incapable of removing microphonic modulation.

Two significant advantages flow from the use of a third order loop designed specifically to eliminate microphonic disturbances. First, the loop bandwidth can be reduced to only as wide as necessary to encompass the package resonance frequencies. These are rarely more than 10,000 Hertz so the PLL bandwidth can be limited to approximately 20 kHz centered about the desired crystal controlled oscillator carrier frequency. This reduced PLL bandwidth reduces the amount of overall phase noise by reducing the total area under the composite phase noise curve. Prior art workers who have widened the bandwidth of second order loops to attempt to eliminate microphonic disturbances have taught taught away from the invention. This is because the bandwidth of the PLL is not the problem in eliminating microphonic disturbances. In fact, a PLL bandwidth that exceeds the crossover points between the VCO phase noise curve and the crystal controlled oscillator's multiplied reference signal phase noise curve actually makes the phase noise problem worse instead of better.

The second advantage of the invention arises from the fact that YIG oscillators have an inherent limitation on the amount of PLL bandwidth that can be used anyway so the reduced bandwidth needs of the PLL of the invention fits nicely within this constraint.

Figure 9:
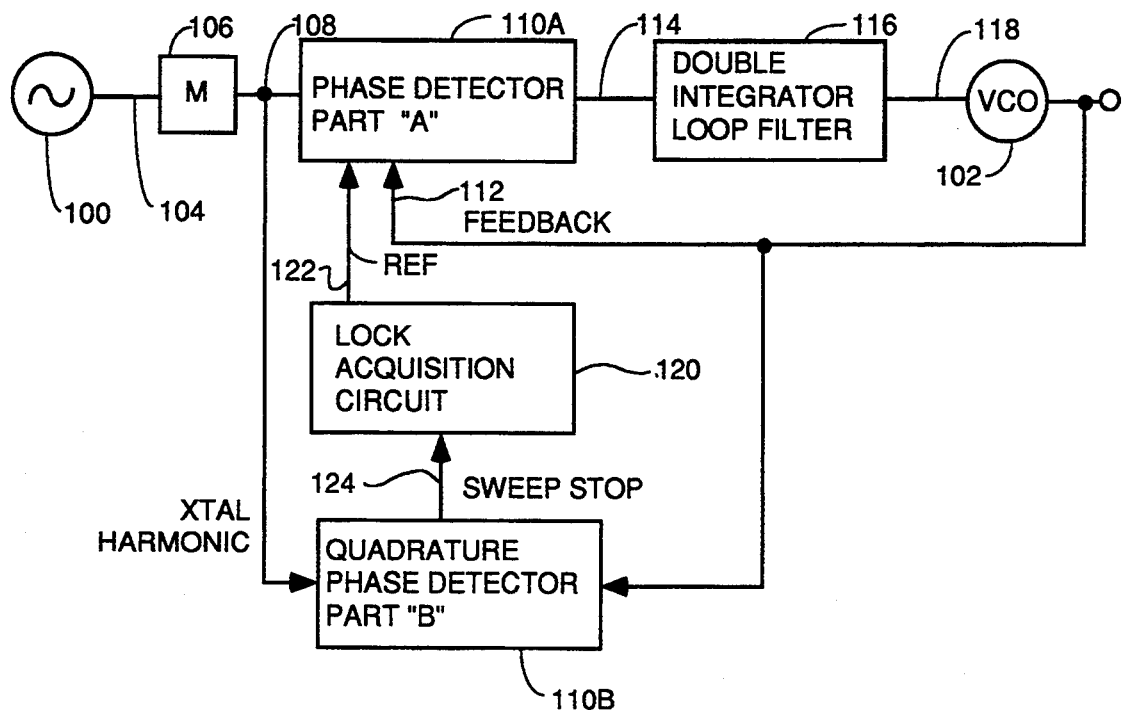
FIG. 9 shows a block diagram of a PLL according to the teachings of the invention.

Referring to FIG. 9, there is shown a block diagram of a third order loop according to the broadest teachings of the invention. A low phase noise, crystal controlled reference oscillator 100 supplies a reference sinusoidal signal to which the phase of the output signal from a voltage controlled oscillator 102 will be locked. The output signal of the reference oscillator 100 on line 104 is input to a multiplier 106. The multiplier generates harmonics of the reference signal on line 104 and outputs the harmonics on line 108. One half, i.e., block 110A, of a phase detector receives the harmonic reference signal on line 108 and receives a feedback signal on line 112 from the output of the VCO 102. The phase detector 110A compares the phase of the feedback signal on line 112 to the phase of the reference harmonic signal on line 108, and generates an error signal on line 114.

Figure 10:
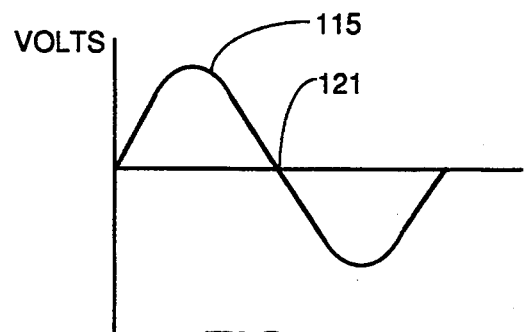
FIG. 10 shows a typical error voltage output function in the time domain for a PLL that is out of lock and shows the desired linear range of operation.

In the preferred embodiment, the phase detector has both an in-phase part (110A) and a quadrature phase detector part (110B), but in other embodiments, other types of phase detectors will also work. As will be explained more fully below, a quadrature lock detector, as is well known in the art, uses a step recovery diode coupled to the reference signal input line such as line 108. The step recovery diode generates a very narrow pulse at the same point in phase of every cycle of the reference signal. This very narrow pulse turns on a pair of microwave sampling diodes to which the feedback signal from the VCO is coupled. The VCO signal is then sampled momentarily, and if it is in phase with the reference signal, an error signal of zero volts will be generated. If the feedback signal is not in phase with the reference signal, the sample pulses from the step recovery diode will occur at a different phase of the feedback signal during each cycle. This causes sampling at multiple points in the cycle of the sinusoidal output signal from the VCO and creates an error signal which is sinusoidal. The phase detector essentially works by virtue of equivalent time sampling when the reference signal and the feedback signal are out of phase to generate an error signal such as error signal 115 shown in FIG. 10. The phase detector therefore has a nonlinear transfer function. For simplicity however, it is desirable to operate the loop such that the error signal is restricted to the linear range of operation of the phase detector. This will only happen when the loop is in lock or close to lock.

When the loop is in phase lock, the error signal is zero volts as shown at point 121. When the phase of the VCO output begins to drift away from the phase of the reference signal, the error signal begins to rise or fall from this zero error quiescent point 121. When this error signal change occurs, a double integrator loop filter 116 integrates the error voltage and applies the result via line 118 to the control voltage input of the VCO 102. This changes the frequency of the output signal on line 112 sufficiently to bring back the error signal back to zero volts as the phase of the feedback signal comes back to the phase of the reference signal.

As explained above, the double integrator loop filter 116 must have a transfer function that can track and eliminate a package peak damped resonance having the time domain function shown in FIG. 7A and the Laplace domain characteristic shown in FIG. 8 with $s^2$, $s$ and constant terms in the denominator. The double integration of the loop filter plus the integration which occurs at the input of the VCO 102 makes the PLL a third order loop.

Third order loops have been recognized by those skilled in the art as difficult to make lock. To alleviate this problem, a special circuit has been added to force the loop to lock. That circuit is discussed below.

Control Structure to Insure Third Order PLL Locks VCO to Reference Frequency In the past, prior art workers have controlled third order loops as second order loops during acquisition, and then carefully switched the loops over to third order loop operation so as to not lose the lock.

By accident, it has been discovered that in a third order loop according to the invention, loop lock can be achieved by manipulation of a reference voltage to the phase detector. Basically, if the reference voltage to the phase detector is swept through the range between the high and low limits of the output voltage of the operational amplifiers that implement the two integrators of the loop filter, there comes a point when the loop is artificially forced into the linear response region of the phase detector. Unlike conventional loops, the extremely high D.C. gain of a broadband double integrator forces the first loop element to enter a non-linear mode of operation to be the loop integrator amplifiers. Forcing them through the linear range by perterbation of the reference voltage will assure that the PLL locks. As soon as this occurs, the third order loop automatically converges and locks onto the phase of the crystal controlled reference signal on line 108 in FIG. 9. As soon as lock occurs, the value of the reference voltage to the phase detector is frozen at the value which caused lock.

The function of lock acquisition circuit 120 in FIG. 9 is to sweep the reference signal on line 122 between the high and low limits of the signal amplitude of the control voltage on line 118. The integrators of the loop filter 116 are implemented by operational amplifiers which have "high rail" and "low rail" operating voltages which are typically +11 volts and +1 volt. These represent the high and low limits for sweep excursions of the VCO frequency control input signal on line 118. As the reference voltage on line 122 is changed, the phase detector portion 110A eventually reaches a point where the error voltage output on line 114 causes the integrators of the loop filter 116 to enter the linear range of operation between the high and low rails. At that point, the PLL is guaranteed to be on a trajectory on the phase plane which converge to a locked condition. This is due primarily to the high loop gain which establishes a so-called "bang-bang" response between the high and low rails. Because the high and low rails establish the maximum limits of frequency excursion of the VCO output frequency, nonconvergent trajectories on the phase plane are eliminated and lock is guaranteed.

The gain of the phase lock loop according to the teachings of the invention is set so high that the loop has a nonlinear response called a "bang-bang" response in the art. This flys in the face of conventional wisdom. Prior art workers, and designers of third order loops for tracking Doppler frequency shifts in particular, used low integrator gain so that their loops could be modelled easier without the complications of the nonlinearities which result from using high gain. High gain in the PLL causes the operational amplifiers to saturate when even a few nanovolts of noise appear at the input. Contrary to this conventional wisdom, the applicant discovered that use of high gain improves the loop acquisition response by forcing the nonlinear acquisition convergence trajectories of the phase plane plot of said third order loop to include only convergent trajectories. This guarantees loop acquisition and locking because the VCO output frequency can never be altered to a frequency which is so far off the reference frequency as to land on a nonconverging phase plane trajectory.

Basically, the applicant has discovered that third order loop convergence can be guaranteed by causing the loop gain to be high enough such that the first component in the loop to enter nonlinearity is one of the loop integrators and not the phase detector. This is in contrast to the Viterbi prior art which teaches that with most phase detector designs in PLLs, the first PLL component to become nonlinear is the phase detector. The Viterbi, Tausworthe and Crow prior art references all teach use of low PLL open loop gain, and this prevents these loops from effectively eliminating phase noise caused by microphonic disturbances. In the invention, any phase plane trajectory that falls within the linear range of the integrators will cause loop lock, and because of the high open loop gain of the PLL of the invention, only these type trajectories are possible.

Figure 17:
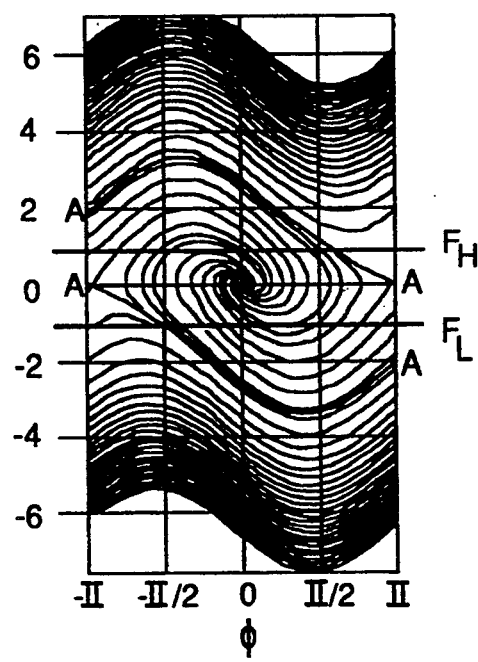
FIG. 17 shows a two dimensional phase plane plot useful for illustration of the convergence properties caused by the high open loop gain and the bang-bang PLL response according to the teachings of the invention.

Reference to FIG. 17 illustrates this concept. FIG. 17 shows a second order loop phase plane plot of convergence trajectories. The second order loop case was used because the phase plane plot can be illustrated on two dimensional paper. The third order case is identical in concept except that the phase "plane" is actually a three dimensional space which does not lend itself to easy illustration on a two dimensional patent drawing. The vertical axis in FIG. 17 represents the frequency of the VCO output signal, while the horizontal axis represents the phase difference between the VCO signal and the reference signal, i.e., the phase error. The two lines $F_H$ and $F_L$ represent the upper and lower limits of frequency output of the VCO that result from the upper and lower voltage rails of the integrator op amps when they saturate. The VCO circuitry is such that the upper and lower voltage rails cause the VCO output frequency to be at either $F_H$ or $F_L$, depending upon which rail the integrator operational amplifier has reached, and the frequencies $F_H$ and $F_L$ are selected so as to be within the natural pull in range of the PLL.

The function of the quadrature portion 110B of the phase detector is to stop sweeping of the reference voltage on line 122 by the lock acquisition circuit once lock is achieved. The quadrature phase detector 110B does this by comparing phase of the feedback signal on line 112 to the phase of the reference signal on line 108. The reference signal on line 108 is shifted in phase by 90 degrees however by a capacitive reactance within the phase detector 110. Therefore, when the reference signal on line 108 and the feedback signal on line 112 are in phase according to the portion 110A of the quadrature phase detector, they will be locked in a 90 degrees phase offset relationship at the portion 110B of the quadrature phase detector. When this condition is detected, the portion 110B of the quadrature phase detector activates the SWEEP STOP signal on line 124. This causes the lock acquisition circuit 120 to stop altering the level of the reference signal on line 122. An important function of the lock acquisition circuit 120 is to "freeze" or hold steady the voltage level of the reference signal on line 122 upon activation of the SWEEP STOP signal on line 124.

Although there are many circuits that could be used to sweep the reference voltage of the phase detector during acquisition mode, the best approach it to use a counter and digital-to-analog converter (hereafter DAC) coupled to a lock detector. This embodiment will be described in more detail below in connection with discussion of the schematic diagram of an embodiment utilizing the teachings of the invention to lower the phase noise characteristic, stabilize and phase lock a YIG VCO. Fundamentally however, in this type embodiment, a ripple counter is coupled to the digital input of a digital-to-analog converter (DAC) and supplies a constantly increasing digital word thereto by counting clock pulses. The DAC converts this sequence of digital numbers to a rising analog voltage which is summed to a reference voltage produced by the detector. The rising reference voltage causes the error voltage of the phase detector output to eventually force the integrators in the loop filter to enter the linear range which causes the PLL to converge on the zero volt error signal quiescent operating point and to lock on phase. When lock occurs, this fact is detected in any known way, e.g., quadrature phase detector, window detector etc., and the digital word then existing at the input to the DAC is "frozen" such as by stopping the counter. This can be done by cutting off the clock input or by latching the then existing digital word and applying the output of the latch to the input to the DAC, etc.

Two alternatives circuits for sweeping the reference voltage of the phase detector are a simple manually operated potentiometer or ramp or saw wave generator coupled with a sample and hold circuit. An example of the sample and hold type circuit is shown in FIG. 11. In FIG. 11, a constant current source generates a constant current which charges capacitor 152 through resistor 154 and switching transistor 156. Control logic 157 controls the state of the switching transistor 156 by manipulation of the NEW SWEEP signal on line 159 coupled to the base of the transistor 156. The control logic 157 serves to control the sequence of events that occur in the sweep circuit. The control logic can be any logic than can generate the sequence of control signals in accordance with the description of the circuit given herein. The NEW SWEEP signal on line 159 is set to logic one when a lock acquisition mode is entered. This turns on transistor 156 and starts the process of charging the capacitor 152. NEW SWEEP remains on until the control logic perceives activation of a control signal SWEEP STOP on line 161. This signal is activated by the lock detector circuit 163 which can be a quadrature phase detector or any other circuit capable of detecting when the FEEDBACK signal on line 112 is in phase with the XTAL HARMONIC reference signal on line 108.

When the SWEEP STOP signal is activated, the control logic deactivates the NEW SWEEP signal thereby cutting off further charging of the capacitor 152. Control logic 157 then activates the signal CONVERT 1 on line 166 to cause an analog-to-digital converter 168 to convert the current analog voltage value on line 162 to a digital value which is output on line 170. This digital value is then latched into the input of a digital-to-analog converter 172 by virtue of activation of 157. The CONVERT 2 signal tells DAC 172 that the digital equivalent of the final analog value for the desired reference voltage on line 122 to part A of the phase detector 110A exists on line 170 and to latch this value and then convert it to an analog voltage for output and holding as the FINAL REF signal on line 174.

The FINAL REF signal is applied to one of two switched inputs of an analog multiplexer 176 the switching position of which is controlled by control logic 157 via a CTL signal on line 178. The other of the two switched inputs of the multiplexer 176 is coupled to the SWEPT REF signal from node 158. During the time the PLL is in lock acquisition mode, the CTL signal on line 178 is controlled to select the SWEPT REF signal on line 162. The rising voltage on that line is then passed through as the REF signal on line 122 to the quadrature phase detector 110A in FIG. 9 and causes convergence. Once lock is achieved, the signal CTL on line 178 is altered by the control logic 157 to select the FINAL REF signal on line 174 and pass it through as the REF signal on line 122.

Any way to sweep the reference voltage through the range between the high and low limits of the output voltage of the operational amplifiers and halting the sweep when lock occurs and holding constant the reference voltage which caused lock to occur will suffice for purposes of practicing the invention. This can even be done manually as where circuits 120 and 110B in FIG. 9 are deleted and a simple potentiometer is coupled to the line 122 to generate the signal REF.

Referring to FIGS. 12 and 13, there are shown frequency response plots for a typical prior art PLL (FIG. 12) and the third order PLL according to the teachings of the invention (FIG. 13). As mentioned earlier, the prior art PLL's are managed as second order loops during lock acquisition as reflected by the −6 dB/octave rolloff segment 200 in FIG. 12 extending from some low frequency up to some frequency $F_0$ at which conversion to second order loop operation occurs. Thereafter, prior art loops are converted to second order operation as reflected in the −12 dB/octave rolloff segment 202. Above the frequency $F_1$ at the unity gain point another break point to a −6 dB/octave segment is used to prevent the loop from oscillating. Such oscillation can be caused by poles in the transfer functions of the amplifiers, etc. Prior art workers tried to remove microphonic disturbances by moving the unity gain frequency $F_1$ in FIG. 12 as high as possible on the frequency scale and adjusting $F_0$ for optimum damping. However, the loop dampening coefficient $\zeta$ is related to the frequency gap between the frequencies $F_0$ and $F_1$. Therefore, as the frequency $F_1$ is moved out further, $F_0$ must also be moved out further to maintain the dampening coefficient $\zeta$ at the desired value. Too great a distance between $F_0$ and $F_1$ is indicative of too large a dampening coefficient which means the loop is too slow to respond to fast disturbances and cannot effectively eliminate them.

In contrast, the loop according to the teachings of the invention operates in −18 dB/octave mode from some low frequency up to a frequency $F_2$, as represented by segment 204 which spans at least the spectral bandwidth of the microphonic disturbances to be eliminated and is usually about two decades. The −18 dB/octave rolloff results from the fact that the PLL filter has two integrators and there is a third integrator inherent in the VCO. The frequency $F_2$ at the break point must occur before the unity gain point at 0 dB is reached but the frequency $F_2$ must also be greater than the frequency of the package peak or other microphonic disturbance to be eliminated. The unity gain point is the horizontal axis in FIG. 13. To insure that the break point at frequency $F_2$ occurs before the unity gain point at frequency $F_1$, two zeroes are added to the transfer function of the PLL filter for stability. If these two zeroes are not added, the third order PLL is not stable. The zeroes are added to set the breakpoint frequency $F_2$ to be at least 10 kHz in the preferred embodiment since the package resonance frequencies rarely rise above 10 kHz. Obviously, if the microphonic disturbances to be eliminated are at frequencies above 10 kHz, the zeroes must be adjusted accordingly so that the frequency $F_2$ is higher than the frequency of the microphonic disturbance, so long as the breakpoint frequency $F_2$ does not occur above the frequency of unity gain. At frequencies above $F_2$, the frequency response of the PLL according to the teachings of the invention is modified to a rolloff of $-6$ dB/octave.

Figure 14:
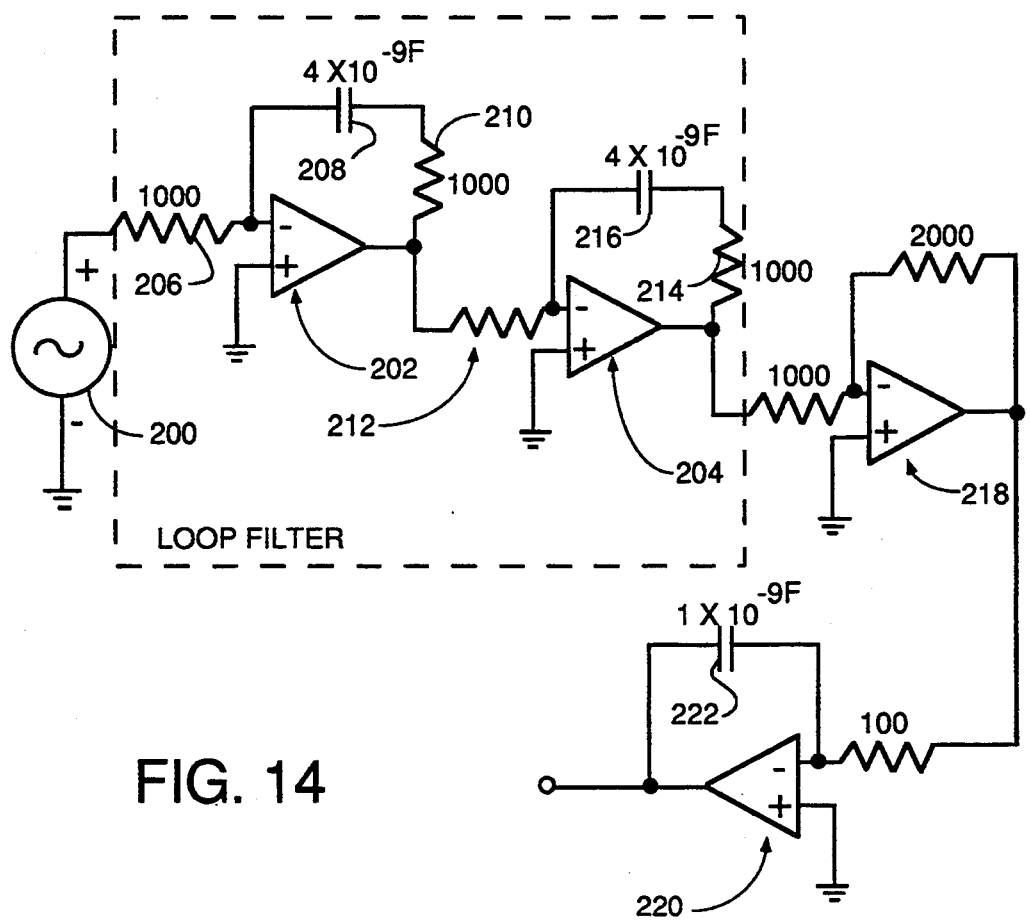
FIG. 14 shows a model of the double integrator loop filter according to the teachings of the invention having two zeroes set at 10 kHz.

Referring to FIG. 14, there is shown a model of a PLL third order filter having characteristics according to the teachings of the invention within a model of the environment in which the teachings of the invention are employed. Signal source 200 represents the sinusoidal output signal from the phase detector and the sinusoidal microphonic disturbance variations therein. Integrators 202 and 204 perform the double integrations of the loop filter. The zeroes in the transfer function of the loop filter to stabilize it mentioned in the paragraph next above, are implemented by the RC combinations comprised of the resistor 210 and the capacitor 208 for one zero and resistor 214 and the capacitor 216 for the second zero. Resistors 210 and 214 are established at 1000 ohms while the capacitors 208 and 216 have capacitances of $4 \times 10^{-9}$ Farads. These values establish the breakpoint frequency $F_2$ at 10 kHz. This breakpoint frequency $F_2$ must be lower than the frequency at which unity gain occurs but higher than the frequency of the highest frequency microphonic disturbance to be eliminated. The positions of the zeroes are established by manipulating the capacitance values of the capacitors 208 and 216 and the resistance values of the resistors 210 and 214. In the embodiment shown in the model of FIG. 14, the two zeroes are placed on top of each other, but in other embodiments the zeroes may not be on top of each other so long as the stability and other rules of design defined herein are satisfied.

The operational amplifier 218 models the gain which the VCO and phase detector provide. The operational amplifier 220 with feedback capacitor 222 models the integration which occurs at the control input of the VCO.

Figure 15:
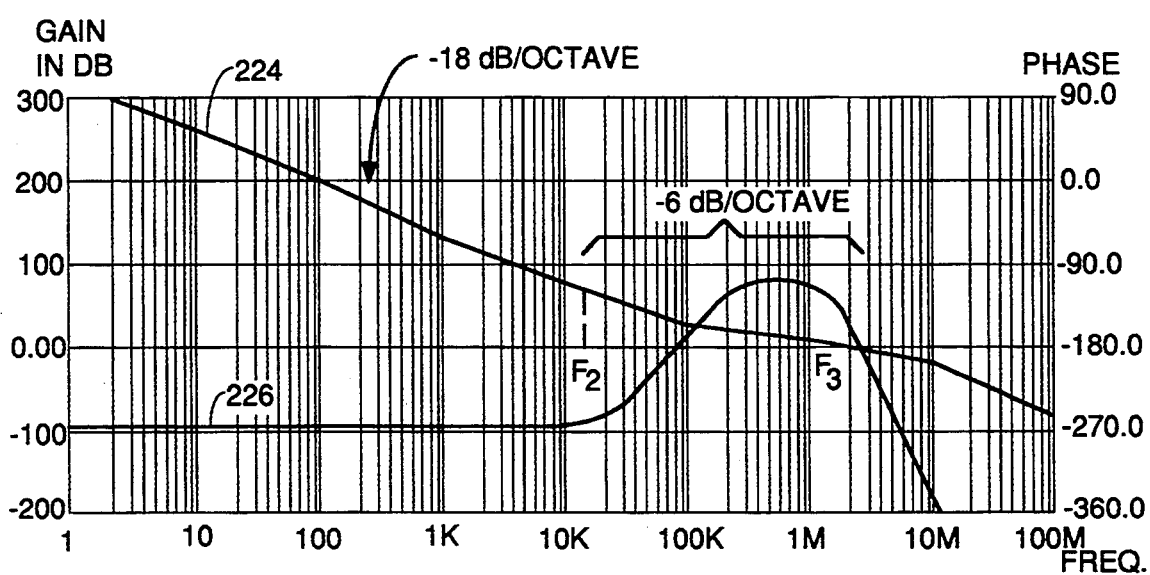
FIG. 15 shows the actual open loop frequency response and phase characteristic of a PLL according to the teachings of the invention as modelled by FIG. 14.

FIG. 15 shows a plot of the open loop frequency response and phase characteristics of the third order loop filter according to the teachings of the invention. Curve 224 represents the frequency response characteristic of the composite transfer function of the third order loop according to the teachings of the invention as modelled by the circuit of FIG. 14. Curve 226 represents the corresponding phase shift imposed by the PLL filter of FIG. 14. The frequency response curve 224 has a $-18$ dB/octave rolloff characteristic from some low frequency up to a frequency $F_2$ of about 10 kHz and then the slope decreases to $-6$ dB/octave rolloff up to about 5-6 Mhz. Above the latter frequency, the rolloff increases again. It is important to establish the zeroes in the composite transfer function of the loop filter such that the frequency $F_2$ extends the $-18$ dB/octave rolloff characteristic from extremely low frequencies up to a frequency $F_2$ which is greater than the frequency of any microphonic disturbances to be eliminated. By extending the $-18$ dB/octave rolloff characteristic down to extremely low frequencies, all microphonic disturbances at any frequencies will be covered by the $-18$ dB/octave rolloff segment. In the preferred embodiment, these zeroes are set at 10 kHz by setting the RC time constants of the resistor/capacitor combinations 208/210 and 216/214 in FIG. 14 to the reciprocal of 10 kHz.

The $-18$ dB/octave rolloff characteristic extends from extremely low frequencies, typically below 1 Hz, up to a frequency $F_2$ of about 10 kHz of the composite transfer function. This distinguises the PLL according to the teachings of the invention from the Tausworthe and Crow prior art discussed above. Tausworthe and Crow taught a third order PLL with only a short segment with a $-18$ dB/octave rolloff characteristic which does not extend down to extremely low frequencies. The Tausworthe and Crow loop acquired lock as a second order loop and then converted to third order loop operation by addition of another pole to remove loop stress because of low open loop gain. Tausworthe and Crow taught using imperfect integrators in order to enable the third order loop to acquire and lock onto the crystal controlled reference frequency. The third order PLL according to the teachings of the invention acquires lock as a third order loop using a different method and operates as a third order loop at all frequencies from extremely low frequencies up to a frequency greater than the frequencies at which most microphonic disturbances are found.

Stabilization of the Third Order Loop According to the Teachings of the Invention Conditional stability of the third order loop according to the teachings of the invention can be achieved by adding a zero to the transfer function such that the loop obeys the Nyquist stability criterion.

It is important in achieving conditional stability that the phase angle of the composite loop transfer function be more positive than $-180$ degrees at the unity gain point. In FIG. 15, the phase angle of the composite PLL transfer function of the PLL according to the teachings of the invention is illustrated at various frequencies by curve 226. Note that the injection of zeroes by the addition of the two integrators represented by operational amplifiers 202 and 204 in FIG. 14 and their RC feedback networks coupled with the integrator circuit 220 representing the VCO control input integration causes the phase angle to start to rise toward $-180$ degrees at about 5 kHz. The phase angle becomes more positive than $-180$ degrees at a frequency of about 30 kHz and remains more positive than $-180$ degrees for all frequencies between about 30 kHz and the unity gain point at about 3 MHz, frequency $F_3$. The frequency at which the phase curve 226 starts to curve upward toward $-180$ degrees of phase is set by the frequencies of the zeroes. Each zero give a $+90$ degree phase shift. Thus, the two integrators 202 and 204 in FIG. 14 with their associated zeroes give a $+180$ degrees phase shift. The additional pole of the integrator 220 modelling the VCO control voltage input gives an additional $-90°$ phase shift. Although these zeroes are located at 10 kHz, it takes about a decade for the resulting phase alteration to take effect on the shape of the phase angle curve 226.

In addition, it is required for conditional stability of the PLL that the PLL have its open loop gain set such that the composite transfer function's $-18$ dB/octave rolloff section (segment 224 in FIG. 15) does not fall below the unity gain point before 10 kHz. This rule can be changed to 7 kHz if the maximum microphonic disturbance frequency is 7 kHz or below. Ideally, the gain will be set such that the −18 dB/octave rolloff section of curve 224 in FIG. 15 does not dip below the unity gain point until a frequency is reached which yields a bandwidth that covers at least the band of frequencies between the crossover frequencies $F_1$ and $F_3$ in FIG. 3A. Of course if the microphonic disturbances typically occur at frequencies farther removed from the desired center frequency represented by line 25 in FIG. 3A, then the open loop gain of the PLL must be set such that the −18 dB/octave rolloff section of curve 224 in FIG. 15 does not dip below the unity gain point until at least the frequency of the maximum microphonic disturbance is reached. Extension of this rule to other frequencies and bandwidths will be well understood by those skilled in the art.

Thus the PLL according to the teachings of the invention can be made conditionally stable if the frequencies of the two zeroes injected by the integrators are correctly set and the open loop gain is correctly set to satisfy the rules described herein. The open loop gain can be set by altering the gain of the phase detector or the integrator operational amplifiers. As can be seen from FIG. 15, the open loop D.C. gain of the PLL of the invention is quite large to satisfy this criteria, because of the fixed −18 dB/octave relationship and required 10 kHz of bandwidth for microphonic elimination.

It is also important to lower the magnitude of the transfer function, i.e., curve 224 in FIG. 15, to a level below the unity gain level at a frequency before the unwanted poles at high frequencies are reached. These unwanted poles are caused by the operational amplifiers etc.

The relationship between the open loop response of the PLL and the closed loop response of the system for a given damping factor can be derived from a Nichols chart. If a PLL is critically damped, it is known that there will be a 2 dB closed loop overshoot. In such a case, the closed loop response for any point on the open loop gain magnitude curve 224 in FIG. 15 for a given phase angle will be found at the intersection of the open loop gain, open loop phase angle and overshoot curve on the Nichols chad. Once the desired bandwidth is achieved within the −18 dB/octave or greater rolloff section of curve 224 in FIG. 15, the Nichols chart can be used to achieve critical damping, by adjusting the gain for proper closed loop overshoot.

Basically any PLL filter design can be used to practice the teachings of the invention so long as the design satisfies the design criteria stated herein.

Preferred Embodiment of Practicing the Invention

Figure 16A:
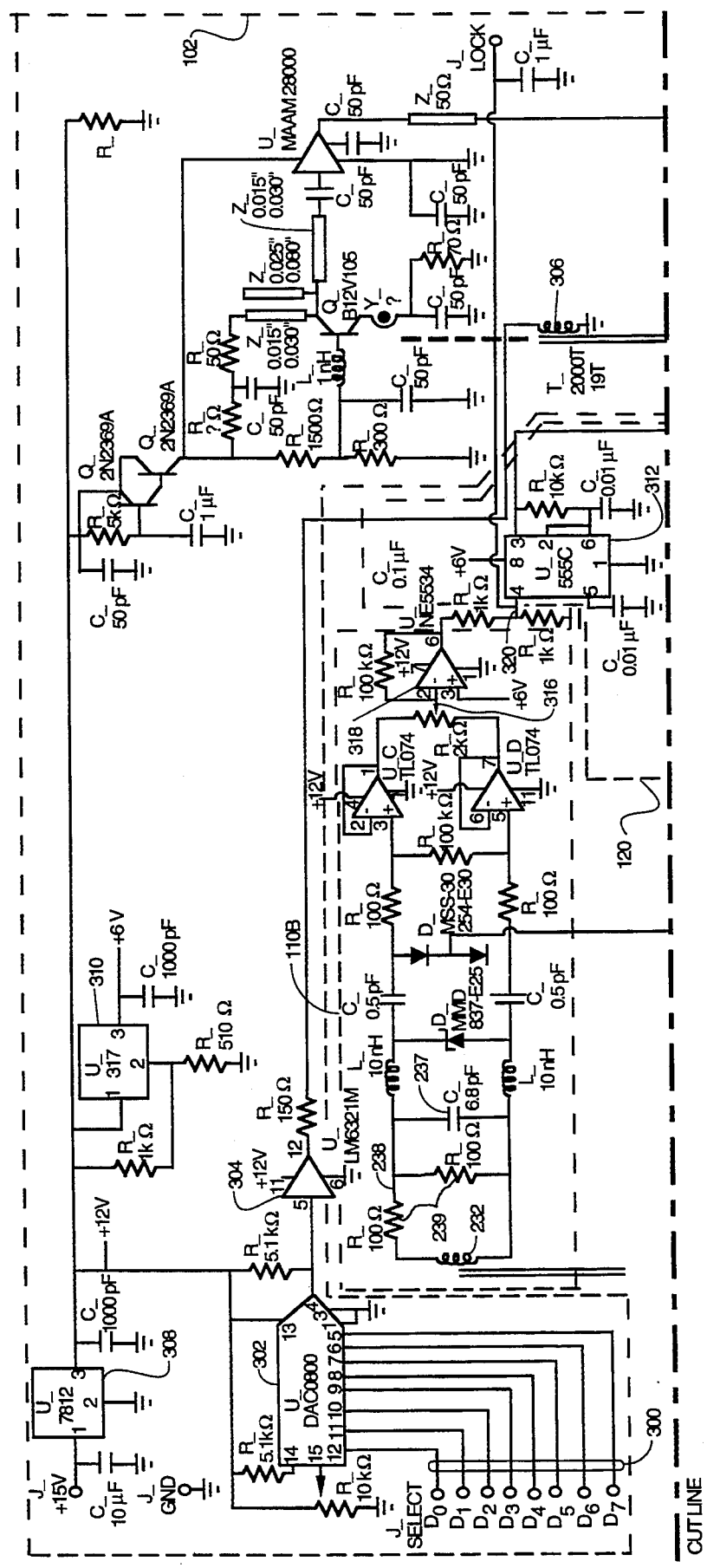
FIG. 16 shows an actual schematic diagram of the preferred embodiment of practicing the invention using a YIG oscillator.
Figure 16B:
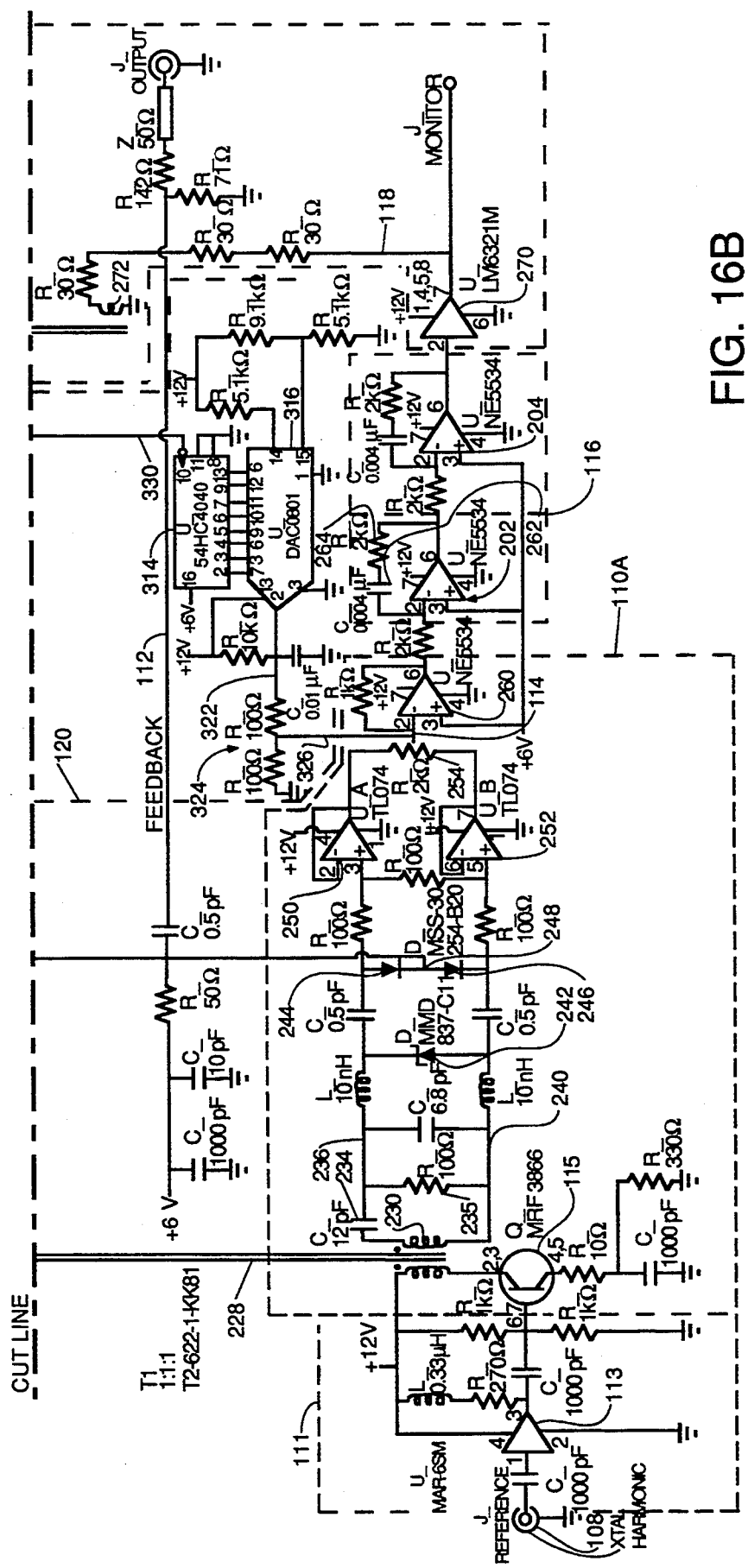

Referring to FIG. 16, there is shown a schematic diagram of the preferred embodiment of practicing the invention. The various circuits which implement one embodiment of the functions shown in the block diagram of FIG. 9 are outlined in dashed lines. These circuits have been given the same reference numbers as were used in FIG. 9 to designate the blocks that perform the corresponding functions. Those skilled in the art will appreciate that there are many other ways of implementing the functions indicated for each block of FIG. 9 without departing from the general functional interactions defined in the block diagram of FIG. 9. All such other embodiments are intended to be included within the scope of the claims appended hereto.

The reference signal is received at port 108 from the crystal oscillator 100 and multiplier 106 (not shown). A buffer amplifier 111 provides isolation and sufficient amplification to drive the other circuits in the PLL.

The phase detector and quadrature phase detector is comprised of two circuits 110A and 110B, respectively. The reference signal received at port 108 is amplified by operational amplifier 113 and transistor 115. The transistor drives an output transformer having secondary windings 230 and 232. The two halves 110A and 110B comprising the phase detector and quadrature phase detector are substantially identical except that phase detector 110A has a capacitor 234 which, when combined with resistor 235 in 110A and capacitor 237 and resistor 239 in quadrature phase detector 110B, provides a 90 degree phase shift of the reference signal on line 238 operated on by circuit 110B relative to the reference signal on line 236 operated on by circuit 110A.

The transformer 228 functions as a balun to convert the singled ended reference signal received at port 108 into a balanced signal on lines 236 and 240 in detector 110A. The same thing happens in detector 110B.

Both the phase detector and the quadrature phase detector work the same way except that there is a small difference caused by the 90 degree phase shift which will be explained below when the lock acquisition circuit is explained. For purposes of this discussion, only phase detector 110A will be explained. The reference signal causes a step recovery diode 242 to emit a "picket fence" comprised of a series of periodic, very narrow sample pulses occurring at the reference frequency. The PLL can lock on any multiple of these sample pulses. Each pulse momentarily turns on the microwave diodes 244 and 246. The FEEDBACK signal on line 112 from the output of the VCO 102 is fed to the centertap node 248 between the two microwave diodes. Whatever voltage exists for the FEEDBACK signal at the instant in time when each sample pulse occurs, will be applied through whichever microwave diode is forward biased by the then existing FEEDBACK signal voltage to the noninverting input of one of the operational amplifiers 250 or 252. A small current will flow as a result which charges the parasitic input capacitance of the appropriate operational amplifier. If the FEEDBACK signal and the reference signal XTAL HARMONIC are not in phase, a voltage drop across potentiometer 254 will be caused by the differential charging of the input capacitances of the two operational amplifiers. This will cause a non-zero error signal to be output on line 114. If the FEEDBACK and XTAL HARMONIC signals are in phase, no differential charging occurs and a zero error signal results on line 114. If the PLL VCO is way off in frequency and phase relative to XTAL HARMONIC, the error signal on line 114 is a sinusoidal signal at a lower frequency by the phenomenon of equivalent time sampling.

Operational amplifier 260 amplifies the error signal and provides it to the input of the first integrator 202 of the loop filter 116. Integrator 202 provide the first −6 dB/octave of rolloff in the overall PLL frequency response and the first zero in the transfer function at approximately 10 kHz. The frequency of this zero is set by the values of the capacitor 262 and the resistor 264. The output of the integrator 202 is then integrated by a second integrator 204 which provides another −6 dB/octave rolloff and the second zero in the transfer function (again at 10 kHz).

The output of the second integrator is buffered by the high current amplifier 270 and is applied via line 118 to the fine tuning control input of the VCO 102.

In the best embodiment, the VCO is a YIG oscillator such as the Model YRO ™ available from Ferretec, Inc. in Fremont, Calif. In other embodiments, the VCO can be a DRO or other type of voltage controlled oscillator. The frequency correction signal on line 118 alters the level of extremely low frequencies bias current flowing through a fine tuning coil 272 for the YIG oscillator.

In the preferred embodiment, the PLL uses a YIG oscillator which can change its frequency by alteration of the intensity of a magnetic field which envelopes a YIG sphere in a cavity. By changing the current in the frequency modulation coil 272, the intensity of the magnetic field is altered which changes the frequency of oscillation and changes the phase relative to the crystal controlled reference signal. Large changes in the oscillation frequency are made by writing a digital word into the input port 300. This digital word is converted by a digital-to-analog converter to a coarse tuning analog voltage which drives a buffer amplifier 304 and a coarse tuning frequency modulation coil 306 magnetically coupled to the same core as the fine tuning FM coil 272..

Circuits 308 and 310 are power conditioning circuits to regulate the voltage to the YIG oscillator 102.

Lock acquisition is achieved using the quadrature phase detector 110B to detect phase lock in conjunction with timer 312, counter 314 and digital-to-analog converter 316 to alter the error signal on line 114 until lock is achieved. During lock acquisition mode, the ripple counter 314 starts to count up. The digital words are input to DAC 316 which converts them to an incrementally rising error voltage on line 322. This voltage is coupled through a voltage divider 324 to error voltage line 114. As the voltage on line 114 rises under the influence of the rising count, the operational amplifier 260 acts as a summer summing the voltage output from the potentiometer 254 with the voltage on line 326. Eventually the resulting error voltage between the reference and inverting port of integrator 202 reaches the linear range between the low and high rails of operational amplifiers 202 and 204. When this happens, the PLL automatically converges and locks to the phase of the crystal controlled reference signal by virtue of the nonlinear characteristics of the phase plane (space) trajectory. When this happens, the quadrature phase detector 110B combines with the timer 312 to stop the count which freezes the analog voltage on line 326 at whatever value caused the lock to occur.

Quadrature phase detector 110B works the same way as the phase detector 110A, except that the reference signal it works on is 90 degrees out of phase to the reference signal the phase detector 110A works on. Phase detector 110A works to phase lock on the zero crossing point of the sinusoidal output error signal. When phase lock occurs in circuit 110A, phase lock also occurs in circuit 110B except that it will occur at the peak of the sinusoidal curve because of the 90 degree phase shift. As a result, phase detector 110B outputs a positive voltage on line 316 when lock is achieved. This voltage is low pass filtered by operational amplifier 318 and capacitor 400 which generates a logic one voltage level on line 320. This causes the timer 312 to change the state of line 330 which turns off the counter.

Those of ordinary skill in the art will realize that the following description of the present invention is illustrative only and not in any way limiting. Other embodiments of the invention will readily suggest themselves to such skilled persons.

While embodiments and applications of this invention have been shown and described, it would be apparent to those skilled in the art that many more modifications than mentioned above are possible without departing from the inventive concepts disclosed herein. The invention, therefore, is not to be restricted except in the spirit of the appended claims.

What is claimed is:

1. A phase lock loop apparatus having a low phase noise and which is capable of tracking and eliminating microphonic disturbances and phase hits, comprising:

an input for receiving a crystal controlled reference signal;

a voltage controlled oscillator having a control input for receiving a frequency control input signal and having an output, for outputting a carrier signal at said output having a frequency, phase and frequency rate of change controlled by said frequency control input signal received at said control input;

a phase detector means coupled to receive said crystal controlled reference signal and said carrier signal and having an output at which is generated an error signal, said phase detector means for comparing the phase of said carrier signal to the phase of said crystal controlled reference signal, and for generating at said output an error signal which is indicative of the degree to which said carrier signal is out of phase with said crystal controlled reference signal;

a loop filter means having an output coupled to said control input of said voltage controlled oscillator and having an input coupled to receive said error signal, said input coupled to at least two operational amplifiers coupled as integrators, said loop filter means having a predetermined open loop third order transfer function or a transfer function of an order higher than third order, said loop filter means for receiving and integrating said error signal using said predetermined open loop gain transfer function so as to generate said frequency control input signal to control the frequency of said voltage controlled oscillator, and wherein said predetermined open loop transfer function has a frequency response characterized by a gain magnitude which rolls off at −18 dB/octave from a predetermined first frequency up to a predetermined second frequency, said predetermined first and second frequencies being spread apart far enough to encompass any Fourier frequency components having significant energy content of a carrier signal which has had its frequency and amplituded disturbed by any microphonic disturbance or phase hit, said third order transfer function also characterized by a phase angle which changes with frequency and an open loop gain which is high enough that the open loop gain of said phase lock loop is greater than one at all frequencies below the frequency at which said phase angle is −180 degrees and is high enough such that said loop filter does not oscillate, said transfer function having sufficient gain to insure that the first component to enter nonlinear operation is an integrator in said loop filter means; and a lock acquisition means coupled to said loop filter means for causing the phase lock loop apparatus to transition from an unlocked to a locked state wherein the frequency, phase and frequency rate of change of said carrier signal tracks the frequency and phase of said crystal controlled reference signal during a lock acquisition mode, said lock acquisition means achieving said locked state by adding a lock acquisition voltage to said error signal and by increasing a lock acquisition voltage incrementally until said error signal plus said lock acquisition voltage causes said locked state to occur, and for holding said lock acquisition voltage constant at whatever voltage caused said locked state to occur.

2. A low phase noise oscillator for generating a carrier signal which is locked in frequency, frequency rate of change and phase to a reference signal, said lock being maintained by a phase locked loop which can track and eliminate second order Laplace ring down response type microphonic disturbances and phase hits which otherwise would cause the frequency and phase of said carrier signal to deviate from the frequency and phase of said reference signal, comprising:

an input for receiving a reference signal;
a phase lock loop, comprising:
 a voltage controlled oscillator for generating a carrier signal at an output and having a frequency control signal input for receiving a frequency control signal which controls the frequency of oscillation of said voltage controlled oscillator, said voltage controlled oscillator inherently integrating the frequency control signal;
 a phase detector coupled to receive said reference signal and said carrier signal for generating an error signal the magnitude of which is indicative of the degree to which said carrier signal is out of phase with said reference signal;
 a loop filter to help phase lock the carrier signal at said output of said voltage controlled oscillator to the phase of said reference signal, said loop filter comprising a first operational amplifier coupled to integrate said error signal and output the result at an output, and a second operational amplifier coupled to integrate the resulting signal appearing at the output of said first operational amplifier thereby generating said frequency control signal for coupling to said frequency control input of said voltage controlled oscillator, said phase lock loop having a third order open loop transfer function characterized by a $-18$ dB/octave rolloff over a band of frequencies that defines a bandwidth which encompasses any Fourier components having any significant energy Fourier spectrum of any carrier signal which has had its frequency and amplitude disturbed by a microphonic disturbance or phase hit, said third order open loop transfer function of said phase lock loop further characterized by a phase angle that varies with frequency and a high open loop gain and by the presence of at least two zeroes the frequencies of which are set to insure that, in combination with the high open loop gain, the gain of said phase lock loop open loop transfer function is greater than one at all frequencies lower than the frequency at which said phase angle passes through $-180$ degrees, and wherein each said operational amplifier causes at least one pole to exist in said open loop transfer function at frequencies above the frequency at which said phase angle passes through $-180$ degrees and wherein said open loop transfer function is further characterized by a gain which reaches and stays at values less than unity at some frequency less than the frequencies of said poles in said transfer function caused by the presence of said operational amplifiers, said phase lock loop open loop transfer function further characterized by an open loop gain which is high enough to insure that the first component in said phase lock loop to enter "bang-bang" type nonlinear operation is always one of said operational amplifiers coupled as an integrator and not the phase detector, wherein said bang-bang type nonlinear operation is characterized by the output voltage of the operational amplifiers immediately transitioning to either a predetermined high voltage limit or a predetermined low voltage limit whenever said carrier signal is not in phase lock with said reference signal;

a lock acquisition circuit for adding an incrementally increasing lock acquisition voltage to said error voltage until said first and second operational amplifiers enter a linear range of operation and said phase lock loop locks the phase of said carrier signal to the phase of said reference signal and for holding said lock acquisition voltage steady at whatever voltage caused said first and second operational amplifiers to enter the linear range and said loop to lock.

3. A low phase noise oscillator including a third order phase lock loop capable of tracking and eliminating phase noise from any microphonic disturbance or phase hit having a spectral content within the bandwidth of said phase lock loop, comprising:

an input for receiving a reference signal;
a phase lock loop, comprising:
 a voltage controlled oscillator with a frequency control input an output at which a phase stabilized carrier signal appears;
 a phase detector coupled to detect the phase difference between said carrier signal and said reference signal and generate an error signal indicative of the magnitude of said phase difference;
 a filter having an input coupled to receive said error signal and having an output coupled to said frequency control input of said voltage controlled oscillator, said filter at least first and second integrators coupled to integrate said error signal, wherein said phase lock loop has an open loop gain transfer function which has at least an $-18$ dB/octave open loop gain rolloff characteristic for at least two decades which at least substantially spans the bandwidth of any microphonic disturbance, phase hit or other phenomenon which alters said carrier frequency, and wherein said phase lock loop has sufficient gain and the frequencies of all zeroes and all poles in said an open loop gain transfer function are such as to prevent said phase lock loop from oscillating, and
 a lock acquisition circuit for adding an incrementally increasing lock acquisition voltage to said error voltage until said first and second integrators enter a linear range of operation and said phase lock loop locks the phase of said carrier signal to the phase of said reference signal and for holding said lock acquisition voltage steady at whatever voltage cause said integrators to enter the linear range and said loop to enter a linear range of operation and to lock.

4. The apparatus of claim 2 wherein said voltage controlled oscillator can operate on a plurality of frequency versus phase trajectories in a phase space plot which includes both converging and non-converging phase space plots, and further comprising high and low voltage power supplies that supply upper and lower supply voltages to said first and second operational amplifiers, said upper and lower supply voltages referred to herein as the upper and lower rails, and wherein said phase lock loop has an open loop gain which is large enough such that the phase lock loop has a "bang-bang" nonlinear response wherein the operational amplifiers immediately transition to a saturated, nonlinear state with their output voltages at either the upper or lower rail voltage when the phase lock loop is out of lock, said upper and lower rails defining the upper and lower maximum excursions of said error signal thereby defining upper and lower limits of the deviation of the frequency of said carrier signal generated by said voltage controlled oscillator referred to herein, respectively, as FH and FL where the voltage values of said upper and lower rails and the resulting carrier frequencies FH and FL are established so as to be within the natural pull-in range of the phase lock loop so that the voltage controlled oscillator operates only on converging trajectories in said phase plane plot which always cause said phase lock loop to lock, and further comprising a lock acquisition circuit for adding an incrementally increasing lock acquisition voltage to said error voltage until said first operational amplifier enters a linear range of operation and said phase lock loop locks the phase of said carrier signal to the phase of said reference signal, and for holding said lock acquisition voltage steady at whatever voltage caused said loop to lock.

5. A low phase noise oscillator, comprising:
an input for receiving a reference signal;
a third order phase lock loop including a voltage controlled oscillator generating a carrier signal having a frequency controlled by the magnitude of a frequency control signal presented at a frequency control input of said voltage controlled oscillator, said carrier signal being phase locked by said phase lock loop to track the frequency and phase of said reference signal, said phase lock loop capable of tracking and eliminating phase noise from a microphonic disturbance or phase hit which would otherwise cause the phase of said carrier signal to temporarily deviate from the phase of said reference signal, said phase lock loop comprising a phase detector which detects the phase difference between said carrier signal and said reference signal and generating an error signal having a magnitude indicative of said phase difference and having a filter including two operational amplifiers connected as integrators to integrate said error signal and supply the result as said frequency control signal, said phase lock loop having an open loop transfer function having at least one pole and at least one zero therein and with at least an $-18$ dB/octave or steeper open loop gain rolloff characteristic extending over substantially all the bandwidth of said microphonic disturbance or phase hit, and having a an open loop gain which is large enough at low frequencies and rolls off at higher frequencies such that, in conjunction with the frequencies of said at least one pole and said at least one zero, oscillation of said phase lock loop is prevented, said open loop gain also being large enough to cause said operational amplifiers to be the first phase lock loop component to enter nonlinear operation when said phase lock loop is not in phase locked condition, said phase lock loop further comprising a lock acquisition circuit for adding an incrementally incrementing acquisition voltage to said error signal integrated by said operational amplifiers until said operational amplifiers enter a linear range of operation and said phase lock loop enters a phase lock condition and for holding said acquisition voltage steady at whatever voltage caused said phase lock loop to lock and adding said acquisition voltage to said error voltage.

6. A low phase noise oscillator, comprising:
an input for receiving a reference signal;
a third order phase lock loop capable of tracking and eliminating phase noise from a phase noise disturbance having a natural frequency and a spectral content bandwidth, said phase lock loop having an open loop gain of approximately 300 dB or higher at 2 Hertz, said phase lock loop comprising:
a voltage controlled oscillator for generating a carrier signal to be phase locked with said reference signal, and having a frequency control input for receiving a frequency control signal which controls the frequency, phase and rate of change of phase of said carrier signal;
a phase detector for comparing the phase of said carrier signal to the phase of said reference signal and for generating an error signal having a magnitude which varies with the phase error;
a filter coupled to receive said error signal and having an output coupled to said frequency control input of said voltage controlled oscillator, said filter including at least first integrator coupled to integrate said error signal and a second integrator coupled to integrate to output of said first integrator, and wherein said phase lock loop has a third order transfer function which has numerator and denominator functions expressed in terms of the Laplace domain variable s, said transfer function having at least one pole at the frequency where the denominator of said transfer function is zero, said transfer function having a phase angle which changes with frequency and has an open loop gain rolloff characteristic of at least $-18$ dB/octave over the bandwidth of any phase noise disturbance, and wherein said open loop gain rolloff characteristic of said phase lock loop is such that the open loop gain of said phase lock loop is greater than one at all frequencies less than the frequency at which said phase angle reaches $-180$ degrees and is less than one at a frequency lower than the frequency of the first pole in said transfer function so as to prevent said phase lock loop from oscillating and which is sufficient to force the first element of the phase lock loop to enter a nonlinear range of operation to be said first and second integrators;
a lock acquisition circuit for adding an incrementally increasing lock acquisition voltage to said error signal until said first and second integrators enter a linear range of operation and said phase lock loop locks the phase of said carrier signal to the phase of said reference signal and for holding said lock acquisition voltage steady at whatever voltage caused said integrators to enter the linear range and said phase lock loop to lock.

7. A phase lock loop apparatus for tracking and eliminating phase noise caused by microphonic disturbances and phase hits in radio signals transmitting phase modulated digital signals, said phase lock loop comprising:

a reference oscillator means having an output for outputting a reference sinusoid signal;

a voltage controlled oscillator having an output which outputs a carrier signal having a frequency which is dependent upon a frequency control input signal applied at a control input;

phase detector means coupled to said outputs of said reference oscillator and said voltage controlled oscillator, said phase detector means further having an output, said phase detector output outputting an error signal which is dependent upon the phase difference between said reference sinusoid signal and said carrier signal;

a loop filter having a first differential amplifier serving as an integrator, said first differential amplifier having a noninverting input coupled to a reference voltage and having an inverting input coupled to receive said error signal with the voltage between said noninverting input and said inverting Input defined as an offset voltage which is amplified by the gain of said first differential amplifier, and having a second differential amplifier serving as an integrator having a noninverting input coupled to a reference voltage and having an inverting input coupled to receive the output signal of said first differential amplifier, said second differential amplifier outputting said frequency control input signal to said voltage controlled oscillator, said frequency control input signal having a magnitude which varies between high and low voltage limits on the output voltage of said first and second differential amplifiers, with the magnitude of said frequency control input signal at any particular time being a function of the magnitude of said error signal, said loop filter having a transfer function with an open loop gain frequency response which rolls off at $-18$ dB/octave over a frequency band that encompasses at least substantially all the spectral content bearing any significant energy of said microphonic disturbances or phase hits phase noise sources to be eliminated, said open loop gain being large enough to prevent said phase lock loop from oscillating and large enough to force said phase lock loop to converge and lock;

a lock acquisition circuit for causing the output signal of said voltage controlled oscillator to lock in phase with said reference sinusoid signal and for detecting said lock condition, said lock acquisition circuit forcing said phase lock loop to lock by adding to said error signal a lock acquisition component and incrementing the voltage of said lock acquisition component until said offset voltage of said first differential amplifier approaches zero thereby forcing said first differential amplifier output voltage to deviate away from one of said high or low voltage limits where said output voltage resides when said phase lock loop is out of lock and to enter a linear region of operation and for holding the value of said lock acquisition component steady at whatever value caused said offset voltage to approach zero thereby causing said phase lock loop to lock when lock is detected by said lock acquisition circuit such that thereafter said frequency control input signal is comprised of the integral of said error signal.

8. A method of generating an oscillator signal with low phase noise and which is substantially locked in phase with a carrier signal having a predetermined frequency comprising the steps of:

receiving said carrier frequency at a reference signal input;

phase locking a local oscillator carrier signal to said reference signal using a phase lock loop having a third order transfer function having at least two zeroes and at least one pole and having a $-18$ dB/octave open loop gain rolloff over a range of frequencies which substantially encompasses all Fourier spectral components having any significant energy of any microphonic disturbance or phase hit which is to be eliminated, said phase lock loop open loop gain at 1–2 Hertz being high enough and said rolloff characteristic being shaped in such a manner to prevent the phase lock loop from oscillating by virtue of the open loop gain being more than one at all frequencies below the frequency at which the phase angle of said open loop transfer function passes through $-180$ degrees and descending to a value less than one at a frequency lower than the frequency of said pole, said phase locking being accomplished by performing the steps of:

comparing the phase of said carrier signal to the phase of a local oscillator signal generated by a voltage controlled oscillator which generates said local oscillator signal at a frequency which varies in accordance with a frequency control signal received at a frequency control input;

generating an error signal having a magnitude in accordance with the magnitude of said phase error;

integrating said error signal with a first operational amplifier integrator and generating a first intermediate signal;

integrating said first intermediate signal with a second operational amplifier integrator to generate said frequency control signal;

applying said frequency control signal to said frequency control input of said voltage controlled oscillator where it is inherently integrated again; and incrementally adding a lock acquisition voltage to said error signal until said first and second operational amplifier integrators enter a linear range of operation and said phase lock loop locks the phase of said local oscillator signal to the phase of said reference signal.

9. The method of claim 8 further comprising the step of varying the frequency of said reference signal according to any random, psuedorandom or spread spectrum communication methodology without stopping the variation in frequency at any frequency.

* * * * *